(12) United States Patent
Oh et al.

(10) Patent No.: US 12,200,981 B2
(45) Date of Patent: Jan. 14, 2025

(54) DISPLAY PANEL, ELECTRONIC DEVICE INCLUDING THE SAME, AND METHOD FOR MANUFACTURING DISPLAY PANEL

(71) Applicant: Samsung Display Co., Ltd., Yongin-Si (KR)

(72) Inventors: Sanghoon Oh, Seoul (KR); Jingoo Jung, Seongnam-si (KR); Yeji Han, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 317 days.

(21) Appl. No.: 17/746,082

(22) Filed: May 17, 2022

(65) Prior Publication Data

US 2023/0010919 A1   Jan. 12, 2023

(30) Foreign Application Priority Data

Jul. 12, 2021   (KR) ........................ 10-2021-0091151

(51) Int. Cl.
| | | |
|---|---|---|
| *H10K 59/124* | (2023.01) | |
| *H10K 59/12* | (2023.01) | |
| *H10K 59/40* | (2023.01) | |
| *H10K 71/00* | (2023.01) | |

(52) U.S. Cl.
CPC ........... *H10K 59/124* (2023.02); *H10K 71/00* (2023.02); *H10K 59/1201* (2023.02); *H10K 59/40* (2023.02)

(58) Field of Classification Search
CPC .. H10K 59/124; H10K 71/00; H10K 59/1201; H10K 59/40; H10K 59/126; H10K 59/121; H10K 59/65; H10K 59/873; H10K 50/844; H10K 50/8426; H10K 50/865; H10K 59/123; G06F 1/1616

See application file for complete search history.

(56) References Cited

U.S. PATENT DOCUMENTS

| | | | |
|---|---|---|---|
| 10,102,789 | B2 | 10/2018 | Evans, V et al. |
| 10,431,767 | B2 | 10/2019 | Woo |
| 11,899,862 | B2 | 2/2024 | Bok et al. |
| 2021/0111199 | A1 | 4/2021 | Chen et al. |
| 2022/0069045 | A1* | 3/2022 | Ebisuno ............ H10K 59/1213 |
| 2022/0406867 | A1* | 12/2022 | Choi ..................... H10K 77/00 |

FOREIGN PATENT DOCUMENTS

| | | |
|---|---|---|
| CN | 109192886 B | 1/2021 |
| KR | 10-2018-0066556 A | 6/2018 |
| KR | 10-2021-0082316 A | 7/2021 |

* cited by examiner

*Primary Examiner* — J. E. Schoenholtz
(74) *Attorney, Agent, or Firm* — Innovation Counsel LLP

(57) ABSTRACT

Provided is an electronic device including a display panel. The display panel may include a substrate, a barrier layer disposed on the substrate, a light blocking layer disposed on the barrier layer and having a first opening defining the transmission region, at least one lower insulating layer disposed between the light blocking layer and the barrier layer, and having a second opening overlapping the first opening, a plurality of pixel circuits disposed on the light blocking layer, a plurality of light emitting elements electrically connected to the plurality of pixel circuits, respectively, and an encapsulation layer covering the plurality of light emitting elements, wherein the barrier layer includes a groove recessed from an upper surface of the barrier layer and overlapping the second opening.

20 Claims, 14 Drawing Sheets

DISPLAY PANEL, ELECTRONIC DEVICE INCLUDING THE SAME, AND METHOD FOR MANUFACTURING DISPLAY PANEL

CROSS-REFERENCE TO RELATED APPLICATIONS

This U.S. non-provisional patent application claims priority under 35 U.S.C. § 119 to Korean Patent Application No. 10-2021-0091151, filed on Jul. 12, 2021, the entire contents of which are hereby incorporated by reference.

BACKGROUND

The present disclosure herein relates to a display panel having a region with improved light transmittance, an electronic device including the same, and a method for manufacturing the display device.

An electronic device may be a device including various electronic components such as a display panel, and an electronic module. The electronic module may include a camera, an infrared detection sensor, a proximity sensor, or the like. The electronic module may be disposed under the display panel. The light transmittance of one region of the display panel may be higher than the light transmittance of another region of the display panel. The electronic module may receive an external input through one region of the display panel or provide an output through one region of the display panel.

SUMMARY

The present disclosure provides a display panel having a region with improved light transmittance, and a method for manufacturing the same.

The present disclosure also provides an electronic device having improved quality of a signal obtained or received by an electronic module.

An embodiment of the inventive concept provides an electronic device including: a display panel including a first region having a transmission region and an element region, and a second region disposed adjacent to the first region; a window disposed on the display panel; an electronic module disposed under the first region of the display panel; and a housing disposed under the display panel and the electronic module. The display panel may include: a substrate; a barrier layer disposed on the substrate; a light blocking layer disposed on the barrier layer and having a first opening defining the transmission region; at least one lower insulating layer disposed between the light blocking layer and the barrier layer and having a second opening overlapping the first opening; a plurality of pixel circuits disposed on the light blocking layer; a plurality of light emitting elements electrically connected to the plurality of pixel circuits, respectively; and an encapsulation layer covering the plurality of light emitting elements, wherein the barrier layer includes a groove recessed from an upper surface of the barrier layer and overlapping the second opening.

In an embodiment, the barrier layer may include a first sub-barrier layer disposed between the substrate and the at least one lower insulating layer, and a second sub-barrier layer disposed between the first sub-barrier layer and the at least one lower insulating layer, wherein the first sub-barrier layer and the second sub-barrier layer may be disposed in both the first region and the second region.

In an embodiment, the groove may be disposed in the second sub-barrier layer in the transmission region.

In an embodiment, the second sub-barrier layer may include a silicon oxide.

In an embodiment, a thickness of a portion of the second sub-barrier layer disposed in the element region may be greater than a thickness of a portion of the second sub-barrier layer disposed in the transmission region.

In an embodiment, a sidewall of the at least one lower insulating layer defining the second opening may protrude more than a sidewall of the barrier layer defining the groove.

In an embodiment, a sidewall of the at least one lower insulating layer defining the second opening may protrude more than a sidewall of the light blocking layer defining the first opening.

In an embodiment, the at least one lower insulating layer may include a first lower insulating layer disposed between the substrate and the light blocking layer, and a second lower insulating layer disposed between the first lower insulating layer and the substrate, and the refractive index of the first lower insulating layer may be different from the refractive index of the second lower insulating layer.

In an embodiment, the first lower insulating layer may include a silicon oxide and the second lower insulating layer may include an amorphous silicon.

In an embodiment, a size of the groove may be larger than a size of the second opening in a plan view.

In an embodiment, a portion of the at least one lower insulating layer may overlap the groove.

In an embodiment of the inventive concept, a method for manufacturing a display panel having a first region including a transmission region and an element region, and a second region disposed adjacent to the first region, according to an embodiment, may include: forming a barrier layer over a substrate; forming at least one preliminary lower insulating layer on the barrier layer; forming a preliminary light blocking layer on the at least one preliminary lower insulating layer; forming a first opening in the preliminary light blocking layer and a second opening in the at least one preliminary lower insulating layer by primary etching a portion of the preliminary light blocking layer and a portion of the at least one preliminary lower insulating layer overlapping the transmission region; forming a light blocking layer and a lower insulating layer by secondary etching on the side surface of the first opening and the side surface of the second opening formed by the primary etching; and forming a groove in the barrier layer by tertiary etching a portion of the barrier layer exposed by the first opening and the second opening.

In an embodiment, the forming of the groove may include wet etching a portion of the barrier layer exposed by the light blocking layer and the lower insulating layer using an etchant.

In an embodiment, the barrier layer may include a silicon oxide layer and the etchant is a buffered oxide etchant BOE.

In an embodiment, the forming of the at least one preliminary lower insulating layer may include: forming an amorphous silicon layer on the barrier layer; and forming a silicon oxide layer on the amorphous silicon layer.

In an embodiment of the inventive concept, a display panel may include: a substrate; a barrier layer disposed on the substrate; a light blocking layer disposed on the barrier layer and having a first opening defining a transmission region; at least one lower insulating layer disposed between the light blocking layer and the barrier layer, and having a second opening overlapping the first opening; a plurality of pixel circuits disposed on the light blocking layer and not overlapping the transmission region; a plurality of light emitting elements electrically connected to the plurality of pixel circuits, respectively; and an encapsulation layer covering the plurality of light emitting elements, and a thickness of the barrier layer disposed in the element region may be greater than a thickness of the barrier layer disposed in the transmission region.

In an embodiment, the barrier layer may include a first sub-barrier layer disposed between the substrate and the at least one lower insulating layer, and a second sub-barrier layer disposed between the first sub-barrier layer and the at least one lower insulating layer, and the second sub-barrier layer includes a groove recessed from an upper surface of the second sub-barrier layer.

In an embodiment, the second sub-barrier layer may include a silicon oxide.

In an embodiment, the at least one lower insulating layer may include a first lower insulating layer disposed between the substrate and the light blocking layer, and a second lower insulating layer disposed between the first lower insulating layer and the substrate, and a refractive index of the first lower insulating layer may be different from a refractive index of the second lower insulating layer.

In an embodiment, the first lower insulating layer may include a silicon oxide, and the second lower insulating layer comprises an amorphous silicon.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
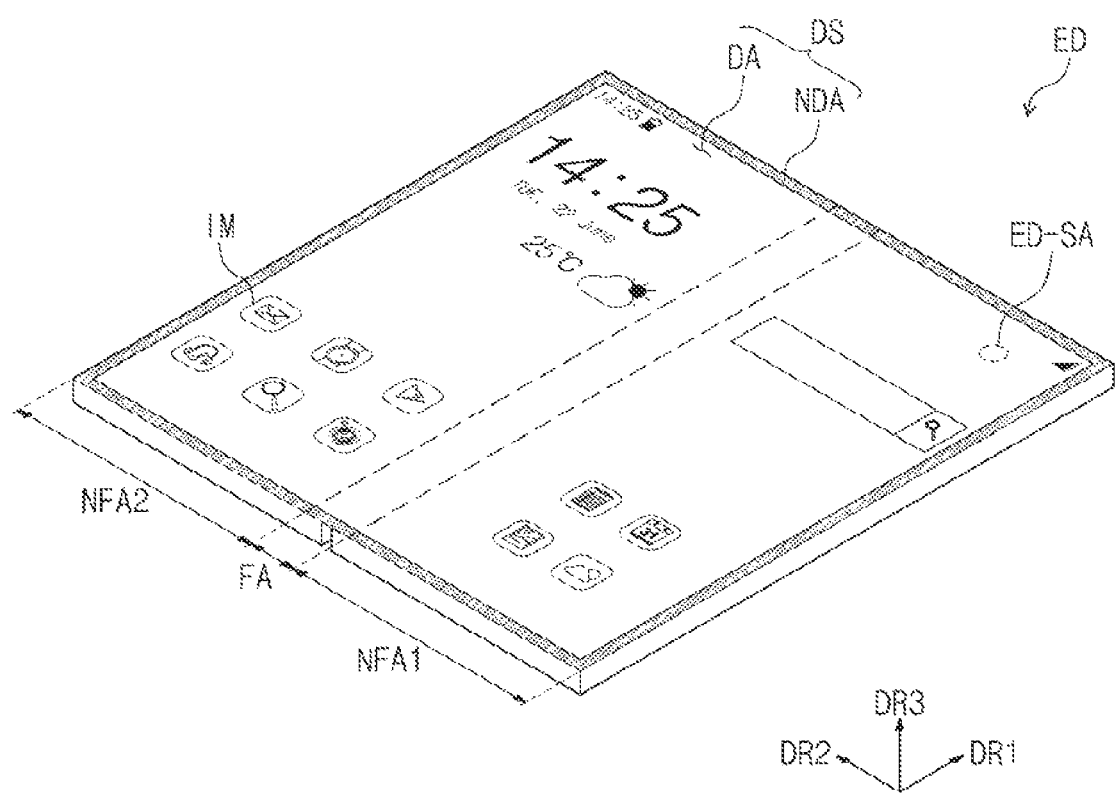
FIG. 1A and FIG. 1B are perspective views of an electronic device according to an embodiment of the inventive concept.

In the present specification, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals or symbols refer to like elements. Also, in the drawings, the thickness, the ratio, and the dimensions of elements are exaggerated for an effective description of technical contents. The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below", "lower", "above", and "upper" are used to describe the relationship between elements shown in the drawings. The terms are relative concepts and are described based on the directions indicated in the drawings.

It should be understood that the terms "comprise", or "have" are intended to specify the presence of stated features, integers, processes, operations, elements, components, or combinations thereof in the disclosure, but do not preclude the presence or addition of one or more other features, integers, processes, operations, elements, components, or combinations thereof.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, embodiments of the inventive concept will be described with reference to the accompanying drawings.

Figure 1B:
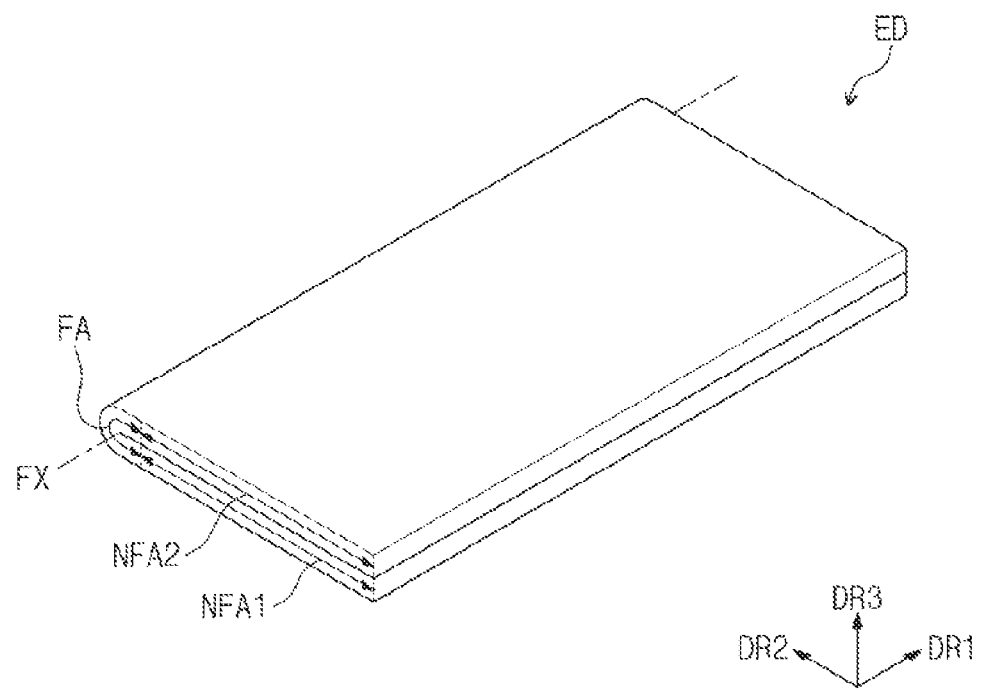

FIG. 1A and FIG. 1B are perspective views of an electronic device ED according to an embodiment of the inventive concept. FIG. 1A illustrates an opened state (or unfolded state) of an electronic device ED, and FIG. 1B illustrates a folded state of an electronic device ED.

Referring to FIG. 1A and FIG. 1B, the electronic device ED according to an embodiment of the inventive concept may include a display surface DS defined by a first direction DR1 and a second direction DR2 intersecting the first direction DR1. The electronic device ED may provide an image IM to a user through the display surface DS.

The display surface DS may include a display region DA and a non-display region NDA around the display region DA. The display region DA may display the image IM, and the non-display region NDA may not display the image IM. The non-display region NDA may surround the display region DA. However, an embodiment of the inventive concept is not limited thereto, and shapes of the display region DA and the non-display region NDA may be altered as needed.

Hereinafter, a direction substantially perpendicular to a plane defined by the first direction DR1 and the second direction DR2 is defined as a third direction DR3. In addition, the wording "in a plan view" may be defined in this specification as a state of being viewed in the third direction DR3.

A sensing region ED-SA may be disposed in the display region DA of the electronic device ED. Although one sensing region ED-SA is illustrated in FIG. 1A as an example, the number of sensing regions ED-SA is not limited thereto. The sensing region ED-SA may be a portion of the display region DA. Accordingly, the electronic device ED may display an image through the sensing region ED-SA.

An electronic module may be disposed in a region overlapping the sensing region ED-SA. The electronic module may receive an external input transmitted through the sensing region ED-SA or provide an output through the sensing region ED-SA. For example, the electronic module may be a camera module, a sensor measuring distance, such as a proximity sensor, a sensor identifying a part of a user's body (e.g., a fingerprint, an iris, or a face), or a small lamp outputting light, but the electronic module is not particularly limited thereto. Hereinafter, the electronic module overlapping the sensing region ED-SA is described as a camera module as an example.

The electronic device ED may include a folding region FA and a plurality of non-folding regions. The non-folding regions may include a first non-folding region NFA1 and a second non-folding region NFA2. In the second direction DR2, the folding region FA may be disposed between the first non-folding region NFA1 and the second non-folding region NFA2. The folding region FA may be referred to as a foldable region, and the first and second non-folding regions NFA1 and NFA2 may be respectively referred to as first and second non-foldable regions.

As illustrated in FIG. 1B, the folding region FA may be folded with reference to a folding axis FX which extends parallel to the first direction DR1. In a state in which the electronic device ED is folded, the folding region FA has a predetermined curvature and a predetermined radius of curvature. The electronic device ED may be inner-folded such that the first non-folding region NFA1 and the second non-folding region NFA2 face each other, and the display surface DS is not exposed to the outside.

In an embodiment of the inventive concept, the electronic device ED may be outer-folded such that the display surface DS is exposed to the outside. In an embodiment, the electronic device ED may be configured such that an in-folding operation, an out-folding operation and an unfolding operation are repeated, but an embodiment is not limited thereto. In an embodiment, the electronic device ED may be configured so that any one of an unfolding operation, an in-folding operation, or an out-folding operation is selected.

Although the foldable electronic device ED is described in FIGS. 1A and 1B as an example, the application of an embodiment of the inventive concept is not limited to the foldable electronic device ED. For example, an embodiment of the inventive concept may include a rigid electronic device, for example, an electronic device that does not include the folding region FA.

Figure 2A:
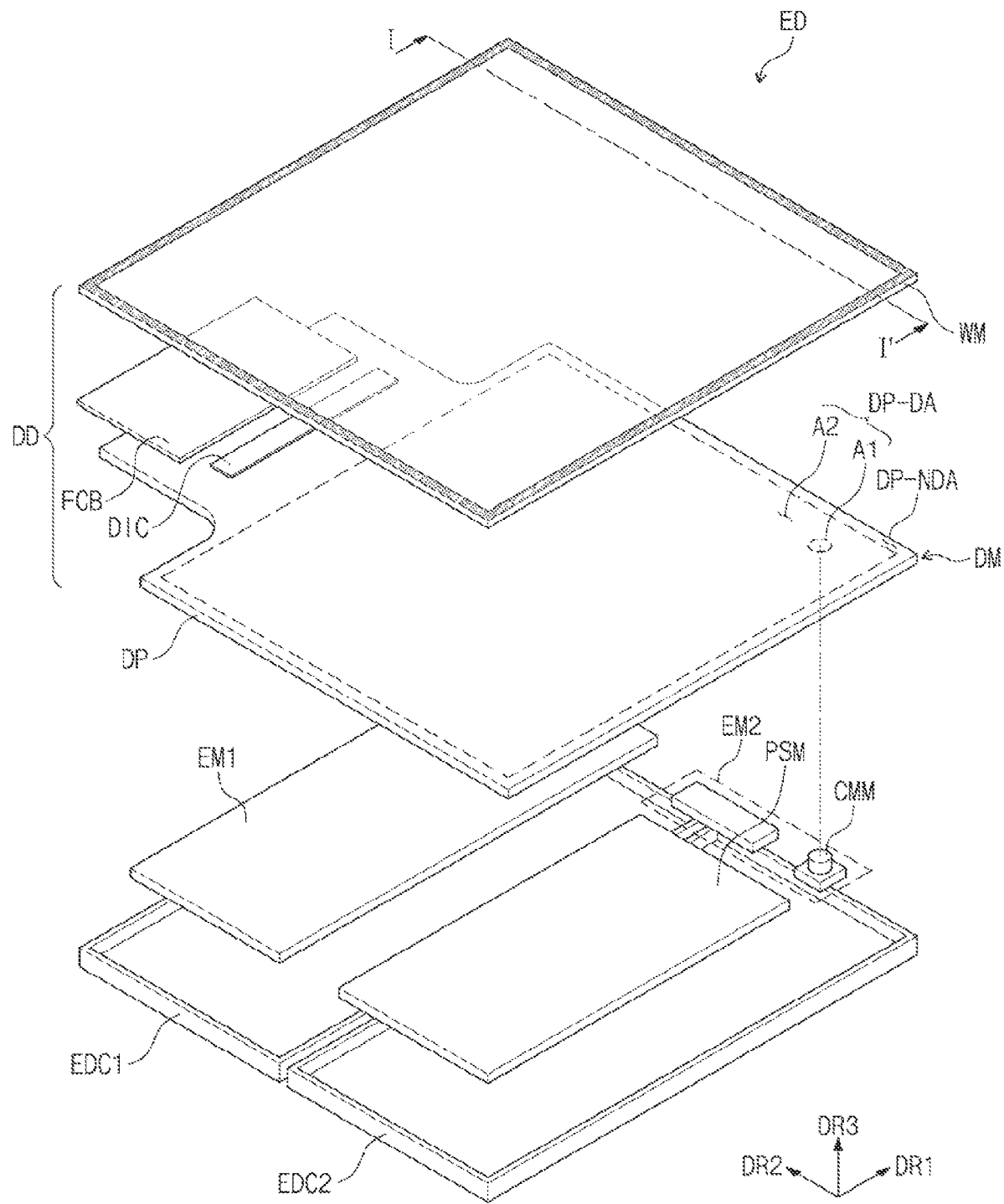
FIG. 2A is an exploded perspective view of an electronic device according to an embodiment of the inventive concept.
Figure 2B:
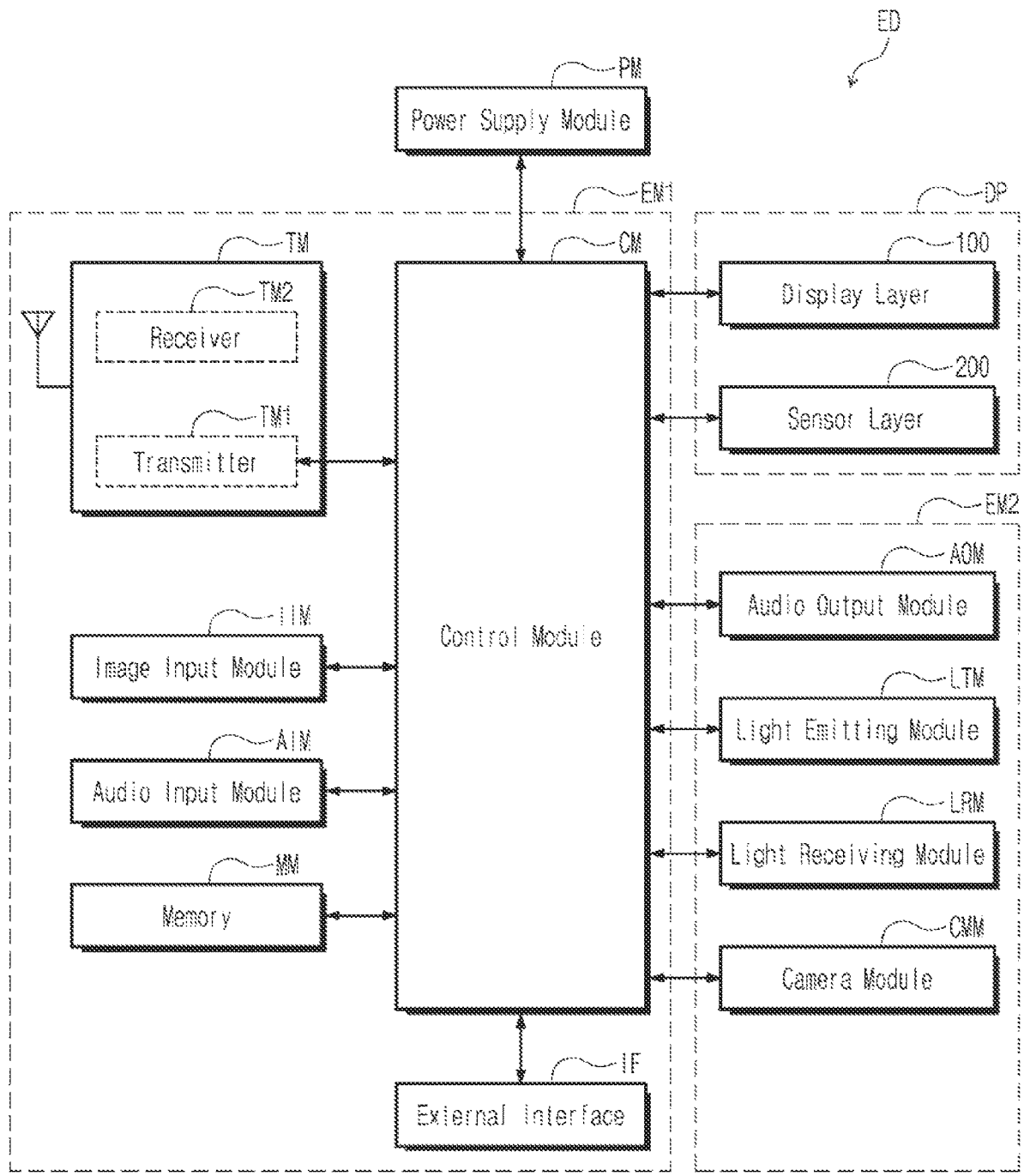
FIG. 2B is a block diagram of an electronic device according to an embodiment of the inventive concept.

FIG. 2A is an exploded perspective view of an electronic device ED according to an embodiment of the inventive concept. FIG. 2B is a block diagram of an electronic device ED according to an embodiment of the inventive concept.

Referring to FIGS. 2A and 2B, the electronic device ED may include a display device DD, a first electronic module EM1, a second electronic module EM2, a power supply module PM, and housings EDC1 and EDC2. Although not illustrated separately, the electronic device ED may further include a mechanical structure for controlling a folding operation of the display device DD.

The display device DD includes a window module WM and a display module DM. The window module WM provides a front surface of the electronic device ED. The display module DM may include at least one display panel DP. The display module DM generates an image and senses an external input.

Although the display module DM is illustrated in FIG. 2A as being the same as the display panel DP, the display module DM may be substantially a laminated structure in which a plurality of components including the display panel DP are laminated. A detailed description of the laminated structure of the display module DM will be given later.

The display panel DP includes a display region DP-DA and a non-display region DP-NDA respectively corresponding to the display region DA (see FIG. 1A) and the non-display region NDA (see FIG. 1A) of the electronic device ED.

In this specification, the wording "region/portion corresponds to another region/portion" means that the regions/portions overlap each other, but the regions/portions are not limited to having the same surface area.

The display region DP-DA may include a first region A1 and a second region A2. The first region A1 may overlap or correspond to the sensing region ED-SA (see FIG. 1A) of the electronic device ED. Although illustrated as a circular shape in this embodiment, the first region A1 may have various shapes such as a polygon, an ellipse, a figure having at least one curved side, and an atypical shape, and is not limited to any one embodiment. The first region A1 may be referred to as a component region, and the second region A2 may be referred to as a main display region or a general display region.

The first region A1 may have a higher light transmittance than the second region A2. In addition, the resolution of the first region A1 may be lower than that of the second region A2. The first region A1 may overlap a camera module CMM to be described later.

The display panel DP may include a display layer 100 and a sensor layer 200.

The display layer 100 may be a component that substantially generates an image. The display layer 100 may be a light emitting display layer and may be, for example, an organic light emitting display layer, an inorganic light emitting display layer, an organic-inorganic light emitting display layer, a quantum dot display layer, a micro-LED display layer, or a nano-LED display layer.

The sensor layer 200 may sense an external input applied from the outside. The external input may be a user's input. The user's input may include various types of external inputs, such as a part of the user's body, light, heat, a pen, and pressure.

The display module DM may include a driving chip DIC disposed in the non-display region DP-NDA. The display module DM may further include a flexible circuit film FCB coupled to the non-display region DP-NDA.

The driving chip DIC may include driving elements for driving pixels of the display panel DP, for example, a data driving circuit. Although FIG. 2A illustrates a structure in which the driving chip DIC is mounted on the display panel DP, an embodiment of the inventive concept is not limited thereto. For example, the driving chip DIC may be mounted on the flexible circuit film FCB.

A power supply module PM supplies power required for an overall operation of the electronic device ED. The power supply module PM may include a typical battery module.

The first electronic module EM1 and the second electronic module EM2 include various functional modules for operating the electronic device ED. Each of the first electronic module EM1 and the second electronic module EM2 may be directly mounted on a motherboard electrically connected to the display panel DP or may be mounted on a separate board to be electrically connected to the motherboard through a connector (not illustrated) and the like.

The first electronic module EM1 may include a control module CM, a wireless communication module TM, an image input module IIM, an audio input module AIM, memory MM, and an external interface IF.

The control module CM controls the overall operation of the electronic device ED. The control module CM may be a microprocessor. For example, the control module CM activates or deactivates the display panel DP. The control module CM may control other modules such as the image input module IIM and the audio input module AIM in response to a touch signal received from the display panel DP.

The wireless communication module TM may communicate with an external electronic device through a first network (e.g., a short-range communication network such as Bluetooth, WiFi direct, and infrared data association (IrDA)) or a second network (e.g., a telecommunication network such as a cellular network, the Internet, and a computer network (e.g., LAN or WAN)). Communication modules included in the wireless communication module TM may be integrated into one component (e.g., a single chip) or implemented as a plurality of components (e.g., a plurality of chips) separated from each other. The wireless communication module TM may transmit/receive a voice signal using a general communication line. The wireless communication module TM may include a transmitter TM1 for modulating and transmitting a signal to be transmitted, and a receiver TM2 for demodulating a received signal.

The image input module IIM processes an image signal and converts the processed image signal into image data that may be displayed on the display panel DP. The audio input module AIM receives an external sound signal by using a microphone in a recording mode, a voice recognition mode, and the like, and converts the received external sound signal into electrical voice data.

The external interface IF may include a connector capable of physically connecting the electronic device ED to an external electronic device. For example, the external interface IF serves as an interface which is connected to an external charger, a wired/wireless data port, a card socket (e.g., a memory card and a SIM/UIM card), and the like.

The second electronic module EM2 may include an audio output module AOM, a light emitting module LTM, a light receiving module LRM, the camera module CMM, and the like. The audio output module AOM converts sound data received from the wireless communication module TM or sound data stored in the memory MM and outputs the converted sound data to the outside.

The light emitting module LTM generates and outputs light. The light emitting module LTM may output infrared rays. The light emitting module LTM may include an LED element. The light receiving module LRM may sense infrared rays. The light receiving module LRM may be activated when infrared rays having a predetermined level or higher are sensed. The light receiving module LRM may include a CMOS image sensor. After infrared rays generated by the light emitting module LTM are outputted, the infrared rays may be reflected by an external object (e.g., a user's finger or face), and the reflected infrared rays may be incident on the light receiving module LRM.

The camera module CMM may capture a still image and a moving image. The camera module CMM may be provided in plurality. Some of the camera modules CMM may overlap the first region A1. An external input (e.g., light) may be provided to the camera module CMM through the first region A1. For example, the camera module CMM may receive natural light through the first region A1 to capture an external image.

The housings EDC1 and EDC2 accommodate the display module DM, the first and second electronic modules EM1 and EM2, and the power supply module PM. The housings EDC1 and EDC2 protect the components accommodated in the housings EDC1 and EDC2, such as the display module DM, the first and second electronic modules EM1 and EM2, and the power supply module PM. Although FIG. 2A illustrates two housings EDC1 and EDC2 separated from each other as an example, an embodiment is not limited thereto. Although not illustrated, a hinge structure for connecting the two housings EDC1 and EDC2 may be further included in the electronic device ED. The housings EDC1 and EDC2 may be coupled to the window module WM.

Figure 3:
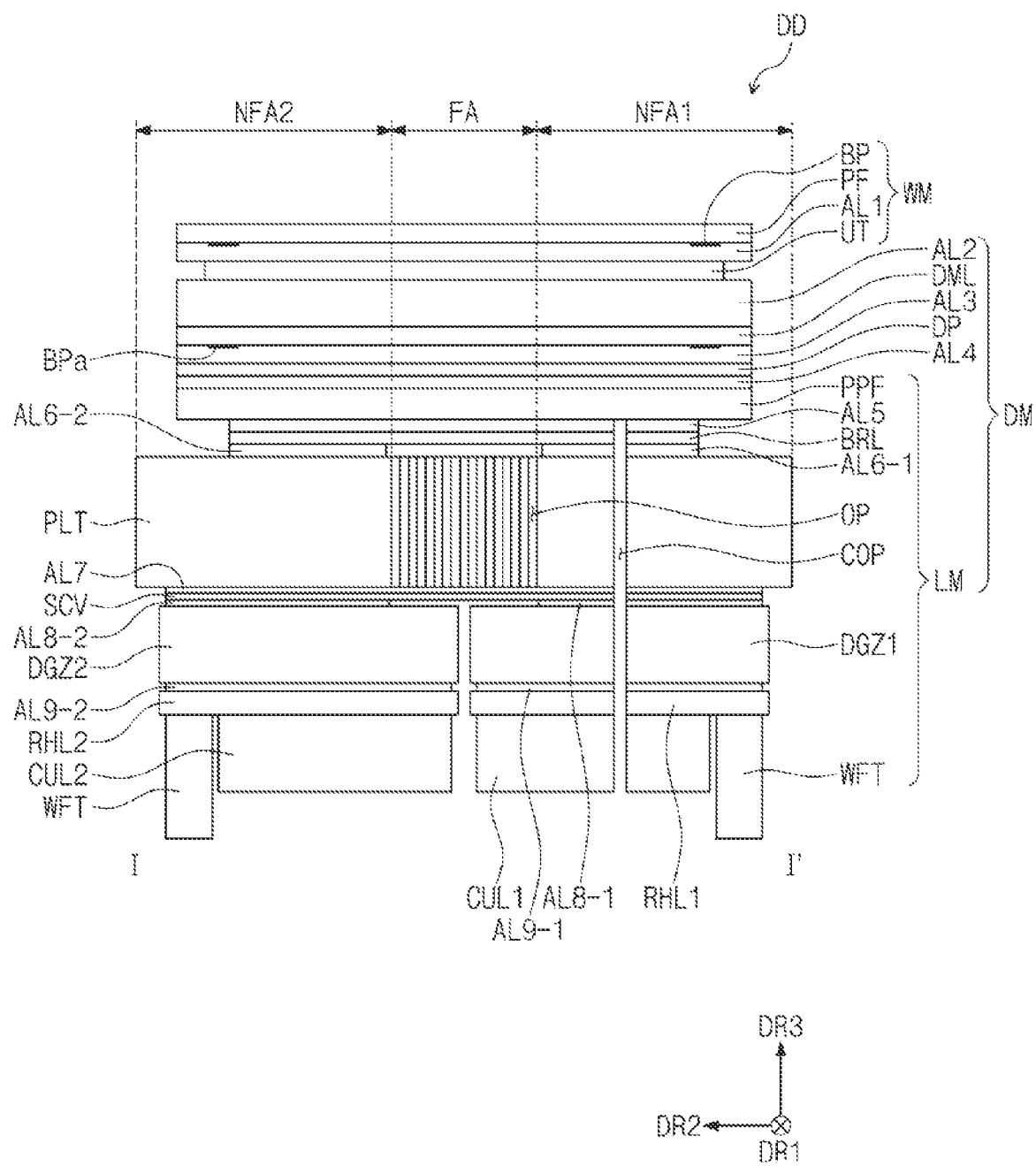
FIG. 3 is a cross-sectional view of a display device taken along line I-I' of FIG. 2A according to an embodiment of the inventive concept.

FIG. 3 is a cross-sectional view of the display device DD taken along line I-I' of FIG. 2A according to an embodiment of the inventive concept.

Referring to FIG. 3, the display device DD may include the window module WM and the display module DM.

The window module WM may include a window UT, a protective film PF disposed on the window UT, and a bezel pattern BP.

The window UT may be chemically reinforced glass. As the window UT is applied to the display device DD, the occurrence of wrinkles may be minimized even when folding and unfolding operations are repeated.

The protective film PF may include polyimide, polycarbonate, polyamide, triacetylcellulose, polymethylmethacrylate, or polyethylene terephthalate. Although not illustrated separately, at least one of a hard coating layer, an anti-fingerprint layer, or an anti-reflection layer may be disposed on a top surface of the protective film PF.

The bezel pattern BP overlaps the non-display region NDA illustrated in FIG. 1A. The bezel pattern BP may be disposed on one surface of the window UT or one surface of the protective film PF. FIG. 3 illustrates the bezel pattern BP disposed on a bottom surface of the protective film PF as an example. The location of the bezel pattern BP is not limited thereto and may also be disposed on a top surface of the protective film PF, a top surface of the window UT, or a bottom surface of the window UT. The bezel pattern BP is a colored light blocking film and may be formed, for example, in a coating method. The bezel pattern BP may include a base material and a dye or pigment mixed with the base material. The bezel pattern BP may have a closed line shape in a plan view.

A first adhesive layer AU may be disposed between the protective film PF and the window UT. The first adhesive layer AU may be a pressure sensitive adhesive (PSA) film or an optically clear adhesive (OCA). Adhesive layers to be described later may be the same as the first adhesive layer AU and may include a typical adhesive.

The first adhesive layer AU may have a thickness greater than a thickness of the bezel pattern BP. For example, the thickness of the bezel pattern BP may be about three micrometers to about eight micrometers and the first adhesive layer AU may have a thickness of a level at which bubbles are not generated on the periphery of the bezel pattern BP.

The first adhesive layer AU may be detached from the window UT. Because the strength of the protective film PF is lower than that of the window UT, scratches may occur relatively easily in the protective film PF. After the first adhesive layer AL1 and the damaged protective film PF are detached from the window UT, a new protective film PF may be attached to the window UT.

The display module DM may include an impact absorbing layer DML, the display panel DP, and a lower member LM.

The impact absorbing layer DML may be disposed on the display panel DP. The impact absorbing layer DML may be a functional layer for protecting the display panel DP from external impact. The impact absorbing layer DML may be bonded to the window UT through a second adhesive layer AL2 and may be bonded to the display panel DP through a third adhesive layer AL3.

An additional bezel pattern BPa overlaps the non-display region NDA illustrated in FIG. 1A. The additional bezel pattern BPa may be disposed on one surface of the impact absorbing layer DML. FIG. 3 illustrates the additional bezel pattern BPa disposed on a bottom surface of the impact absorbing layer DML as an example. The additional bezel pattern BPa may include the same material as the above-described bezel pattern BP. In an embodiment of the inventive concept, the additional bezel pattern BPa may be omitted.

The lower member LM may be disposed under the display panel DP. The lower member LM may be bonded to the display panel DP through a fourth adhesive layer AL4. The lower member LM may include a panel protective layer PPF, a barrier layer BRL, a support layer PLT, a cover layer SCV, a first digitizer DGZ1, a second digitizer DGZ2, a first lower plate RHL1, a second lower plate RHL2, a first cushion layer CUL1, a second cushion layer CUL2, and a waterproof tape WFT. In an embodiment of the inventive concept, the lower member LM may not include some of the above-described components or may further include other components. In addition, a laminating order of the components illustrated in FIG. 3 is merely an example and may be altered as needed.

The panel protective layer PPF may be disposed under the display panel DP. The fourth adhesive layer AL4 may bond the panel protective layer PPF to the display panel DP. The panel protective layer PPF may protect the lower portion of the display panel DP. The panel protective layer PPF may include a flexible plastic material. The panel protective layer PPF may prevent scratches from being generated on a rear surface of the display panel DP during a manufacturing process of the display panel DP. The panel protective layer PPF may be a colored polyimide film. For example, the panel protective layer PPF may be an opaque yellow film but is not limited thereto.

The barrier layer BRL may be disposed under the panel protective layer PPF. A fifth adhesive layer AL5 may be disposed between the panel protective layer PPF and the barrier layer BRL to bond the barrier layer BRL to the panel protective layer PPF. The barrier layer BRL may increase resistance to a compressive force caused by external pressing. Accordingly, the barrier layer BRL may serve to prevent deformation of the display panel DP. The barrier layer BRL may include a flexible plastic material such as polyimide and polyethylene terephthalate.

In addition, the barrier layer BRL may absorb light incident from the outside. The barrier layer BRL may include a light blocking material or may be a colored film having low light transmittance. For example, the barrier layer BRL may be a black plastic film and may be, for example, a black polyimide film. When the display module DM is viewed from above the window module WM, the components disposed under the barrier layer BRL may not be viewed by a user.

The support layer PLT is disposed under the barrier layer BRL. The support layer PLT supports the components disposed on the support layer PLT and maintains an unfolded state and a folded state of the display device DD. In an embodiment of the inventive concept, the support layer PLT may include at least a first support part corresponding to the first non-folding region NFA1, a second support part corresponding to the second non-folding region NFA2, and a folding part corresponding to the folding region FA. The first support part and the second support part may be spaced apart from each other in the second direction DR2. The folding part may be disposed between the first support part and the second support part, and a plurality of openings OP may be defined in the folding part. The flexibility of a portion of the support layer PLT may be improved by the openings OP in the folding part. The flexibility of the portion of the support layer PLT may be improved by the openings OP.

The support layer PLT may include carbon fiber reinforced plastic (CFRP) but the material forming the support layer PLT is not particularly limited thereto. Alternatively, the first support part and the second support part may include a non-metallic material, plastic, glass fiber reinforced plastic, or glass. The plastic may include polyimide, polyethylene, or polyethylene terephthalate, but the material forming the plastic is not particularly limited. The first support part and the second support part may include the same material. The folding part may include the same material as the first and second support parts, or may include a material different from that of the first and second support parts. For example, the folding part may include a material having an elastic modulus of about 60 GPa or higher and may include a metal material such as stainless steel. Although the folding part may include, e.g., SUS 304, the material forming the folding part is not limited thereto and may include various metal materials.

A sixth adhesive layer AL6-1 and AL6-2 may be disposed between the barrier layer BRL and the support layer PLT. The sixth adhesive layer AL6-1 and AL6-2 may bond the barrier layer BRL to the support layer PLT. In a plan view, the sixth adhesive layer AL6-1 and AL6-2 may not overlap the plurality of openings OP. In addition, in a plan view, the sixth adhesive layer AL6-1 and AL6-2 may be spaced apart from the plurality of openings OP.

The sixth adhesive layer AL6-1 and AL6-2 may include a first part AL6-1 and a second part AL6-2 spaced apart from each other. The first part AL6-1 and the second part AL6-2 may be spaced apart from each other with the plurality of openings OP disposed therebetween. The first part AL6-1 may overlap the first non-folding region NFA1, the second part AL6-2 may overlap the second non-folding region NFA2, and each of the first part AL6-1 and the second part AL6-2 may not overlap the folding region FA. Because the sixth adhesive layer AL6-1 and AL6-2 is not disposed in a region corresponding to the folding region FA, the flexibility of the support layer PLT may be improved.

In a region overlapping the folding region FA, the barrier layer BRL may be spaced apart from the support layer PLT. That is, an empty space may be formed between the support layer PLT and the barrier layer BRL in the region overlapping the folding region FA.

Since the empty space is formed between the barrier layer BRL and the support layer PLT, the shape of the plurality of openings OP defined in the support layer PLT may not be viewed from outside of the electronic device ED (see FIG. 1A) when the electronic device ED (see FIG. 1A) is folded.

In addition, as the barrier layer BRL includes the light blocking material or employs the colored film having low light transmittance, a color difference in the support layer PLT may not be viewed from the outside. For example, in the support layer PLT, a color difference may not be viewed from the outside between a first support region having the plurality of openings OP defined therein and a second support region not having the plurality of openings OP defined therein. The first support region may be a region overlapping the folding region FA, and the second support region may be a region overlapping the first non-folding region NFA1 and the second non-folding region NFA2.

The sixth adhesive layer AL6-1 and AL6-2 may be thinner than the fifth adhesive layer AL5. For example, a thickness of the fifth adhesive layer AL5 may be about 25 micrometers, and a thickness of the sixth adhesive layer AL6 may be about 16 micrometers.

As the sixth adhesive layer AL6 becomes thinner, a step due to the sixth adhesive layer AL6 may be reduced. As the step becomes smaller, there is an advantage of decreasing shape deformation of the laminated components caused by folding and unfolding operations of the electronic device ED (see FIG. 1A), but the plurality of openings OP may be viewed, or the sixth adhesive layer AL6 may be separated by repeated folding operations. As the sixth adhesive layer AL6 becomes thicker, the plurality of openings OP may not be viewed, and there is an advantage that reliability of the adhesive force of the sixth adhesive layer AL6 is enhanced when folding operations are repeated, but the step may increase. Accordingly, the thickness of the sixth adhesive layer AL6 may be selected within an appropriate range in consideration of folding reliability, adhesion reliability, and the probability that the plurality of openings OP are viewed.

A seventh adhesive layer AL7 may be disposed under the support layer PLT, and the cover layer SCV may be disposed under the seventh adhesive layer AL7. The support layer PLT and the cover layer SCV may be bonded to each other by the seventh adhesive layer AL7. The cover layer SCV may be manufactured in the form of a sheet and attached to the support layer PLT.

The seventh adhesive layer AL7 and the cover layer SCV may cover the plurality of openings OP defined in the support layer PLT. Accordingly, the cover layer SCV may prevent foreign matter from being introduced into the plurality of openings OP. The cover layer SCV may have a lower elastic modulus than the support layer PLT. For example, the cover layer SCV may include thermoplastic polyurethane, rubber, or silicone, but is not limited thereto.

An eighth adhesive layer AL8-1 and AL8-2 may be disposed under the cover layer SCV. The eighth adhesive layer AL8-1 and AL8-2 may include a first part AL8-1 and a second part AL8-2. The first part AL8-1 and the second part AL8-2 may be spaced apart from each other. In a plan view, the first part AL8-1 and the second part AL8-2 may be spaced apart from each other with the plurality of openings OP disposed therebetween. The first part AL8-1 and the second part AL8-2 may not overlap the folding region FA in a plan view.

The first digitizer DGZ1 and the second digitizer DGZ2 may be respectively disposed under the first part AL8-1 and the second part AL8-2. The first digitizer DGZ1 may be attached to the first part AL8-1 and the second digitizer DGZ2 may be attached to the second part AL8-2. The first digitizer DGZ1 and the second digitizer DGZ2 are disposed to be spaced apart from each other with a predetermined gap disposed therebetween. The gap may be disposed to correspond to the folding region FA. In a plan view, a portion of the first digitizer DGZ1 may overlap a portion of the plurality of openings OP and a portion of the second digitizer DGZ2 may overlap another portion of the plurality of openings OP.

Each of the first and second digitizers DGZ1 and DGZ2 may include a plurality of loop coils that generate a magnetic field having a preset resonance frequency with an electronic pen. The first and second digitizers DGZ1 and DGZ2 may be referred to as an electromagnetic radiation (EMR) sensing panel.

The magnetic field generated in the first digitizer DGZ1 and the second digitizer DGZ2 is applied to an LC resonance circuit that includes an inductor (a coil) and a capacitor of the pen. The coil generates a current by the received magnetic field and transmits the generated current to the capacitor. Accordingly, the capacitor charges the current input from the coil and discharges the charged current to the coil. As a result, a magnetic field of the resonance frequency is emitted from the coil. The magnetic field emitted by the pen may be absorbed again by the loop coils of the digitizers, and accordingly, the location of the pen may be determined.

A ninth adhesive layer AL9-1 and AL9-2 may be disposed under the first digitizer DGZ1 and the second digitizer DGZ2. The ninth adhesive layer AL9-1 and AL9-2 may include a first part AL9-1 and a second part AL9-2. The first part AL9-1 and the second part AL9-2 may be spaced apart from each other.

The first lower plate RHL1 and the second lower plate RHL2 may be respectively disposed under the first part AL9-1 and the second part AL9-2. The first lower plate RHL1 and the second lower plate RHL2 may protect the components on the first lower plate RHL1 and the second lower plate RHL2 from external pressure. The first lower plate RHL1 and the second lower plate RHL2 may include SUS 316 but the material forming the first lower plate RHL1 and the second lower plate RHL2 are not particularly limited thereto.

The first cushion layer CUL1 and the second cushion layer CUL2 may be respectively disposed under the first lower plate RHL1 and the second lower plate RHL2. The first cushion layer CUL1 and the second cushion layer CUL2 may absorb external impact to protect the display panel DP. The first cushion layer CUL1 and the second cushion layer CUL2 may include a foam sheet having a predetermined elastic force. Each of the first cushion layer CUL1 and the second cushion layer CUL2 may include a sponge or polyurethane.

The waterproof tape WFT may be attached to the first lower plate RHL1 and the second lower plate RHL2. For example, the waterproof tape WFT may be disposed outside the first cushion layer CUL1 and the second cushion layer CUL2. The waterproof tape WFT may be attached to a set bracket (not illustrated). A thickness of the waterproof tape WFT may be greater than a thickness of each of the first cushion layer CUL1 and the second cushion layer CUL2. Even when the electronic device ED (see FIG. 2A) is submerged into water, the waterproof tape WFT may reduce the risk that the driving chip DIC (see FIG. 2A) is damaged.

A through-hole COP may be defined in at least some of the components constituting the lower member LM. The through-hole COP may overlap or correspond to the sensing region ED-SA (see FIG. 1A) of the electronic device ED. At least a portion of the camera module CMM (see FIG. 2A) may be inserted into the through-hole COP.

Figure 4:
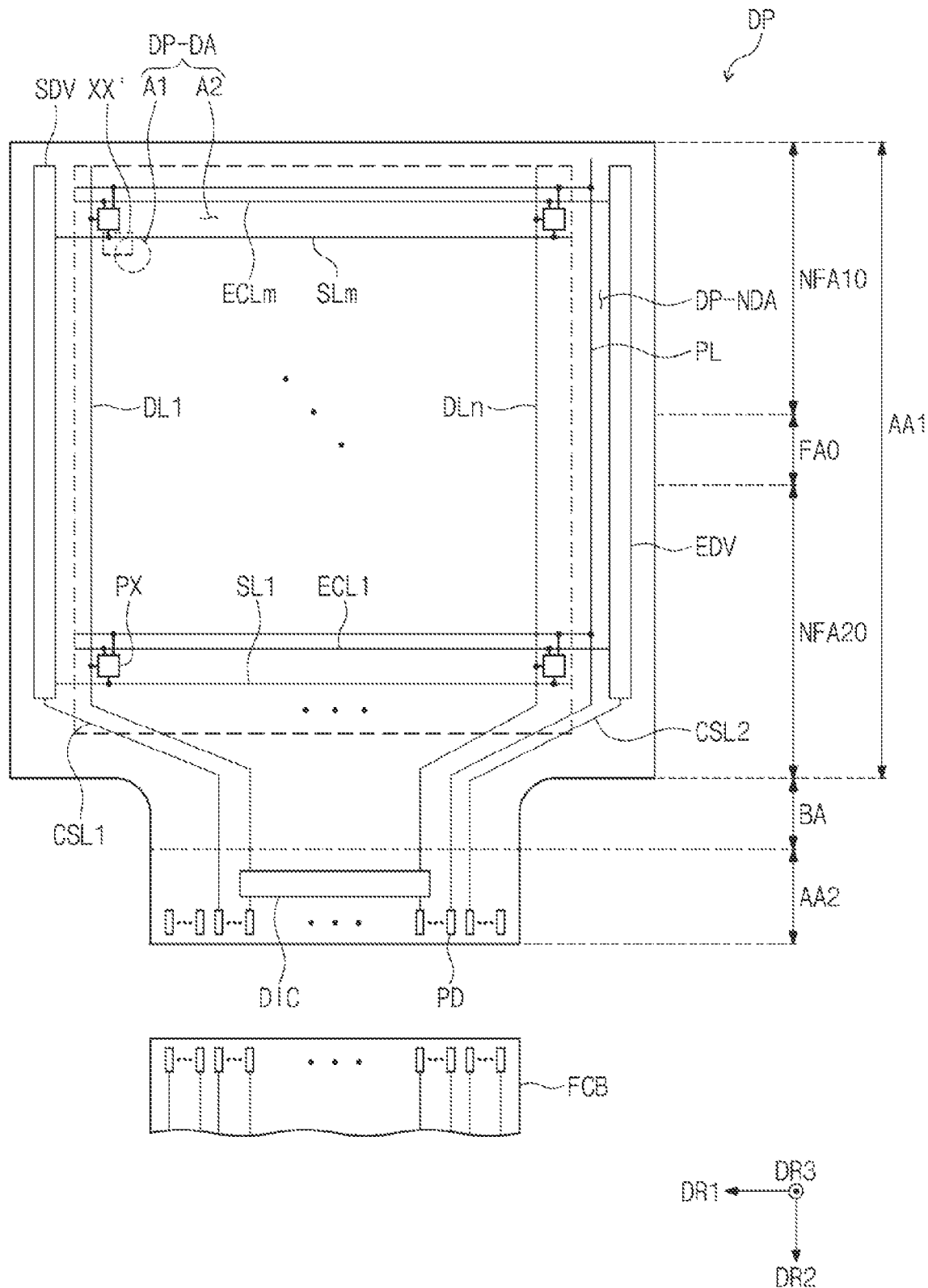
FIG. 4 is a plan view of a display panel according to an embodiment of the inventive concept.

FIG. 4 is a plan view of the display panel DP according to an embodiment of the inventive concept.

Referring to FIG. 4, the display region DP-DA and the non-display region DP-NDA around the display region DP-DA may be defined in the display panel DP. The display region DP-DA may include pixels PX and the non-display region DP-NDA may not include pixels PX. A scan driver SDV, a data driver, and an emission driver EDV may be disposed in the non-display region DP-NDA. The data driver may be some of circuits included the driving chip DIC.

The display region DP-DA may include the first region A1 and the second region A2. The first region A1 may be different from the second region A2 in that a distance between the pixels PX, the size of each of the pixels PX, and/or an existence of transmission regions TP (see FIG. 5). A detailed description of the first region A1 and the second region A2 will be given later.

The display panel DP may include a first panel region AA1, a bending region BA, and a second panel region AA2 disposed along the second direction DR2. The second panel region AA2 and the bending region BA may be a partial region of the non-display region DP-NDA. The bending region BA is disposed between the first panel region AA1 and the second panel region AA2.

The first panel region AA1 is a region corresponding to the display surface DS of FIG. 1A. The first panel region AA1 may include a first non-folding region NFA10, a second non-folding region NFA20, and a folding region FAO. The first non-folding region NFA10, the second non-folding region NFA20, and the folding region FAO respectively correspond to the first non-folding region NFA1, the second non-folding region NFA2, and the folding region FA of FIG. 1A and FIG. 1B.

A width (or a length) of the bending region BA and a width (or a length) of the second panel region AA2 measured in a direction parallel to the first direction DR1 may be smaller than a width (or a length) of the first panel region AA1 measured in a direction parallel to the first direction DR1. A region having a shorter length in a direction of a bending axis may be bent more easily.

The display panel DP may include the plurality of pixels PX, a plurality of scan lines SL1 to SLm, a plurality of data lines DL1 to DLn, a plurality of emission control lines ECL1 to ECLm, first and second control lines CSL1 and CSL2, a driving voltage line PL, and a plurality of pads PD. Here, m and n are natural numbers. The pixels PX may be connected to the scan lines SL1 to SLm, the data lines DL1 to DLn, and the emission control lines ECL1 to ECLm.

The scan lines SL1 to SLm may extend in the first direction DR1 and may be electrically connected to the scan driver SDV. The data lines DL1 to DLn may extend in the second direction DR2 and may be electrically connected to the driving chip DIC via the bending region BA. The emission control lines ECL1 to ECLm may extend in the first direction DR1 and may be electrically connected to the emission driver EDV.

The driving voltage line PL may include a portion extending in the first direction DR1 and a portion extending in the second direction DR2. The portion extending in the first direction DR1 and the portion extending in the second direction DR2 may be disposed on different layers. The portion of the driving voltage line PL extending in the second direction DR2 may extend to the second panel region AA2 via the bending region BA. The driving voltage line PL may provide a first voltage to the pixels PX.

The first control line CSL1 may be connected to the scan driver SDV and may extend toward a lower end of the second panel region AA2 via the bending region BA. The second control line CSL2 may be connected to the emission driver EDV and may extend toward the lower end of the second panel region AA2 via the bending region BA.

In a plan view, the pads PD may be disposed adjacent to the lower end of the second panel region AA2. The driving chip DIC, the driving voltage line PL, the first control line CSL1, and the second control line CSL2 may be electrically connected to the pads PD, respectively. The flexible circuit film FCB may be electrically connected to the pads PD through an anisotropic conductive adhesive layer.

Figure 5:
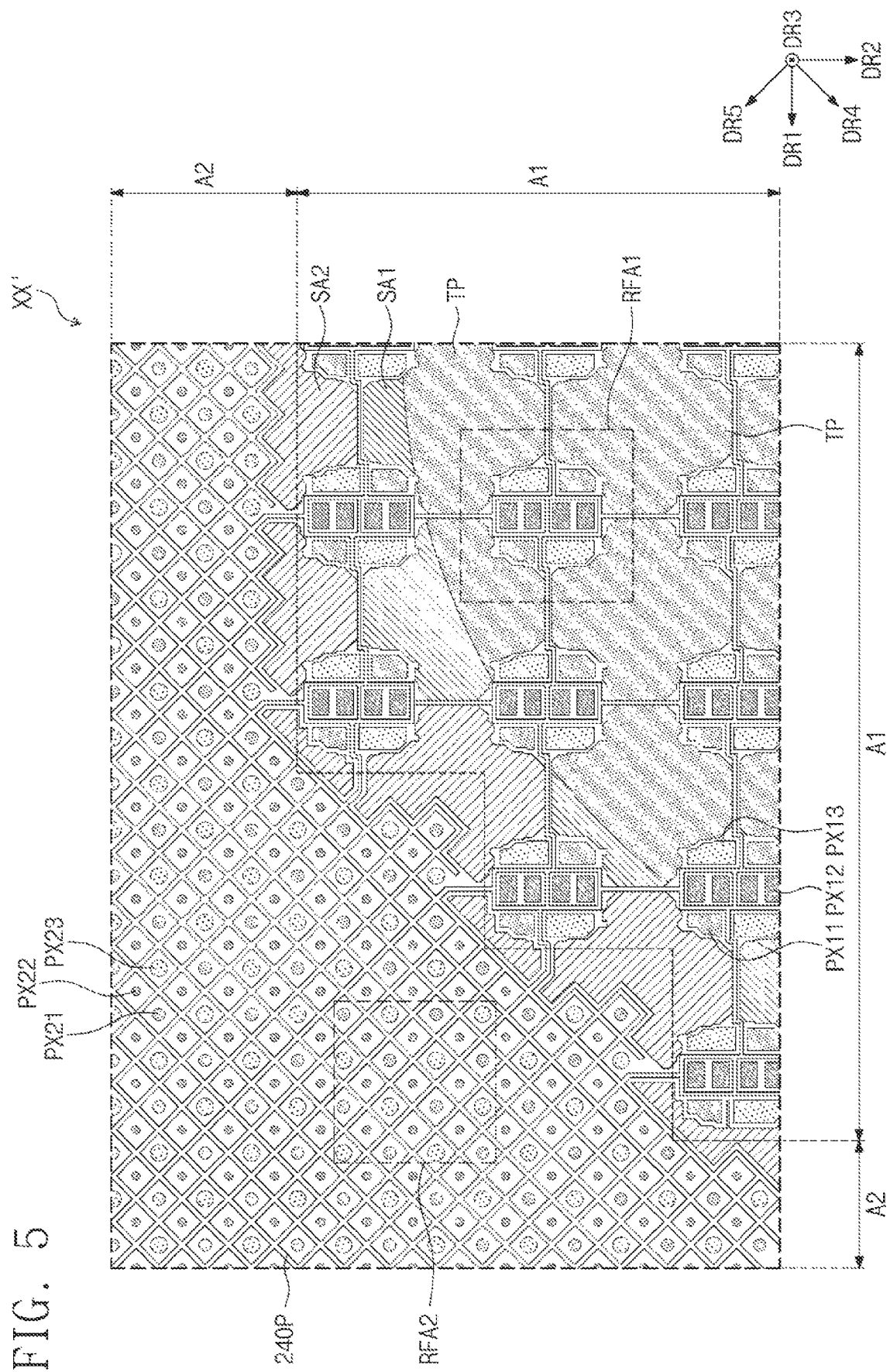
FIG. 5 is an enlarged plan view illustrating a region XX' illustrated in FIG. 4.

FIG. 5 is an enlarged plan view illustrating the region XX' illustrated in FIG. 4.

Referring to FIG. 4 and FIG. 5, the pixel PX is provided in plurality, and the plurality of pixels PX may include a plurality of first pixels PX11, PX12, and PX13 disposed in the first region A1, and a plurality of second pixels PX21, PX22, and PX23 disposed in the second region A2. A shape, in a plan view, of each of the plurality of first pixels PX11, PX12, and PX13 and the plurality of second pixels PX21, PX22, and PX23 illustrated in FIG. 5 may correspond to an emission surface area by one light emitting element LD (see FIG. 6).

A first number, which is the number of the plurality of first pixels PX11, PX12, and PX13 disposed in a first predetermined area RFA1, may be smaller than a second number, which is the number of the plurality of second pixels PX21, PX22, and PX23 disposed in a second predetermined area RFA2. Accordingly, a resolution of the first region A1 may be lower than that of the second region A2. A surface area of the first predetermined area RFA1 disposed in the first region A1 and a surface area of the second predetermined area RFA2 disposed in the second region A2 may have the same shape and the same size. For example, the first number may be 8, and the second number may be 25. However, this is merely an example for describing the difference in resolution, and the first number and the second number are not limited to the above example.

The plurality of first pixels PX11, PX12, and PX13 may include first red pixels PX11, first green pixels PX12, and first blue pixels PX13. The plurality of second pixels PX21, PX22, and PX23 may include second red pixels PX21, second green pixels PX22, and second blue pixels PX23.

In the first region A1, two first red pixels PX11, four first green pixels PX12, and two first blue pixels PX13 may be disposed adjacent to each other. For example, the four first green pixels PX12 may be arranged in the second direction DR2, and one of the first red pixels PX11 and one of the first blue pixels PX13 may be spaced apart from each other in the first direction DR1 with two first green pixels PX12 interposed therebetween. In addition, one of the first red pixels PX11 may be spaced apart from one of the first blue pixels PX13 in the second direction DR2.

The plurality of transmission regions TP may be disposed in the first region A1 of the display panel DP. The transmission regions TP may be disposed to be spaced apart from each other in the first region A1. Two first red pixels PX11, four first green pixels PX12, and two first blue pixels PX13 described above may be defined as one group, and the one group may be adjacent to at least one of the transmission regions TP. As the transmission regions TP are defined in the first region A1, the light transmittance of the first region A1 may be higher than that of the second region A2.

A first sub-region SA1 and a second sub-region SA2 may be further defined in the first region A1. Light transmittance of the transmission region TP may be higher than the light transmittance of each of the first sub-region SA1 and the second sub-region SA2. For example, the transmission region TP, the first sub-region SA1, and the second sub-region SA2 are defined by the light blocking layer BML (see FIG. 7), and the transmission region TP and the first and second sub-regions SA1 and SA2 may be divided according to whether they are covered by the partition layer 310 (see FIG. 7) or the pixel defining layer PDL (see FIG. 7). In an embodiment of the inventive concept, the second sub-region SA2 may be omitted.

Figure 7:
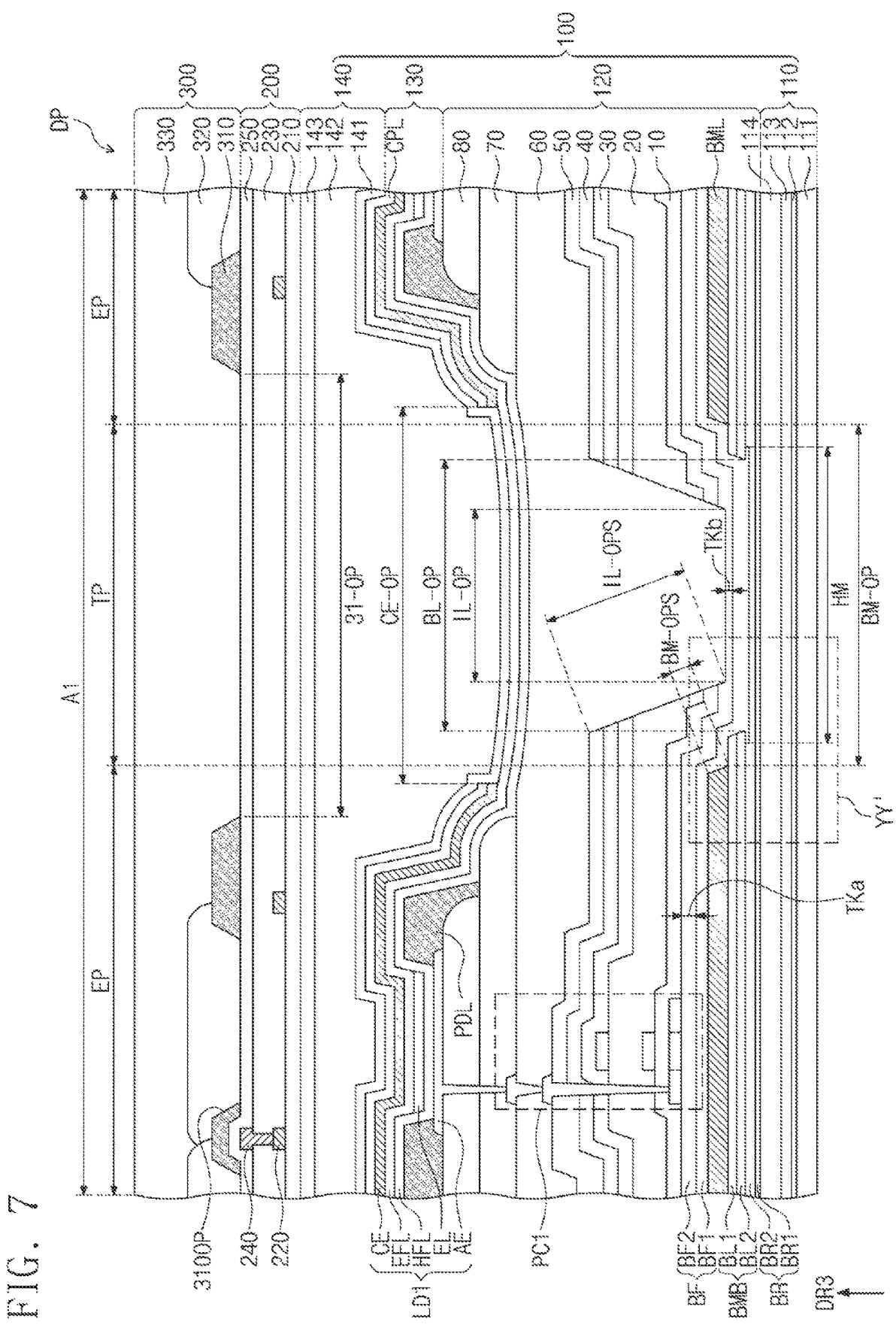
FIG. 7 is a cross-sectional view illustrating a first region of a display panel according to an embodiment of the inventive concept.

For example, the first sub-region SA1 may be in contact with the transmission region TP and may be a portion covered by a partition layer 310 (see FIG. 7). In addition, the second sub-region SA2 is a region spaced apart from the transmission region TP and may be covered by the partition layer 310 (see FIG. 7). Accordingly, the first sub-region SA1 and the second sub-region SA2 and may not transmit light or may have transmittance lower than that of the transmission region TP. Accordingly, the first sub-region SA1 and the second sub-region SA2 may be referred to as a light blocking region.

In FIG. 5, different hatching is used to distinguish the first sub-region SA1 from the transmission region TP in contact with the first sub-region SAE In addition, different hatching is used in the second sub-regions SA2 to distinguish the second sub-regions SA2 from the first sub-region SAE The second sub-region SA2 may be disposed adjacent to the second region A2. For example, the second sub-region SA2 may be in contact with a boundary between the first region A1 and the second region A2. The second sub-region SA2 may be defined in the first region A1 or the second region A2 between the first pixels PX11, PX12, and PX13 and the second pixels PX21, PX22, and PX23. Accordingly, the second sub-region SA2 may be disposed adjacent to the pixel group disposed in the first region A1 and the pixel group disposed in the second region A2. An area of the second sub-region SA2 may be smaller than an area of the transmission region TP.

In an embodiment of the inventive concept, a pixel defining layer PDL (see FIG. 7) may be further disposed in the second sub-region SA2. A pixel defining layer PDL (see FIG. 7) may not be disposed in the transmission regions TP and the first sub-region SAE That is, the first sub-region SA1 may not overlap the pixel defining layer PDL (see FIG. 7) and may overlap the partition layer 310 (see FIG. 7). The second sub-region SA2 may overlap both the pixel defining layer PDL (see FIG. 7) and the partition layer 310 (see FIG. 7). The transmission region TP may not overlap both the pixel defining layer PDL (see FIG. 7) and the partition layer 310 (see FIG. 7).

A line connecting a boundary between the first sub-region SA1 and the transmission region TP may form a curve. When the boundaries between the first sub-regions SA1 and the transmission regions TP are connected, a circular shape may be derived. The first sub-region SA 1 and the second sub-region SA2 are disposed in the first region A1 adjacent to the second region A2. A region, in which the second sub-regions SA2 and the first sub-regions SA1 are defined, of the first region A1 may be defined as a boundary region. That is, in the boundary region, two first red pixels PX11, four first green pixels PX12, and two first blue pixels PX13 are disposed adjacent to each other to form one group, and the one group may be adjacent to at least one first sub-region SA1 and/or at least one second sub-region SA2 that are covered by the partition layer 310 (see FIG. 9) and have relatively low light transmittance compared with the transmission regions.

In the second region A2, the second red pixels PX21 and the second green pixels PX22 may be arranged to be alternately repeated one by one in each of a fourth direction DR4 and a fifth direction DR5. In addition, in the second region A2, the second blue pixels PX23 and the second green pixels PX22 may be arranged to be alternately repeated one by one in each of the fourth and fifth directions DR4 and DR5. The fourth direction DR4 may be a direction between the first direction DR1 and the second direction DR2, and the fifth direction DR5 may be a direction crossing or perpendicular to the fourth direction DR4. In relation to one second green pixel PX22, a corresponding one of the second red pixels PX21 may be spaced apart in the fourth direction DR4, and a corresponding one of the second blue pixels PX23 may be spaced apart in the fifth direction DR5.

In the second region A2, the second red pixels PX21 and the second blue pixels PX23 may be arranged to be alternately repeated one by one in each of the first direction DR1 and the second direction DR2. The second green pixels PX22 may be arranged to be repeated in the first direction DR1 and the second direction DR2.

A surface area of each of the first red pixels PX11 may be greater than a surface area of each of the second red pixels PX21, a surface area of each of the first green pixels PX12 may be greater than a surface area of each of the second green pixels PX22, and a surface area of each of the first blue pixels PX13 may be greater than a surface area of each of the second blue pixels PX23. However, this is merely illustrated as an example, and the surface area relation between the first red, first green, and first blue pixels PX11, PX12, and PX13 and the second red, second green, and second blue pixels PX21, PX22, and PX23 is not limited to the above-described example.

In addition, a shape of the first red pixel PX11 may be different from that of the second red pixel PX21, a shape of the first green pixel PX12 may be different from that of the second green pixel PX22, and a shape of the first blue pixel PX13 may be different from that of the second blue pixel PX23. However, this is merely illustrated as an example, and the shapes of the first red, first green, and first blue pixels PX11, PX12, and PX13 may be respectively the same as the shapes of the second red, second green, and second blue pixels PX21, PX22, and PX23.

Figure 6:
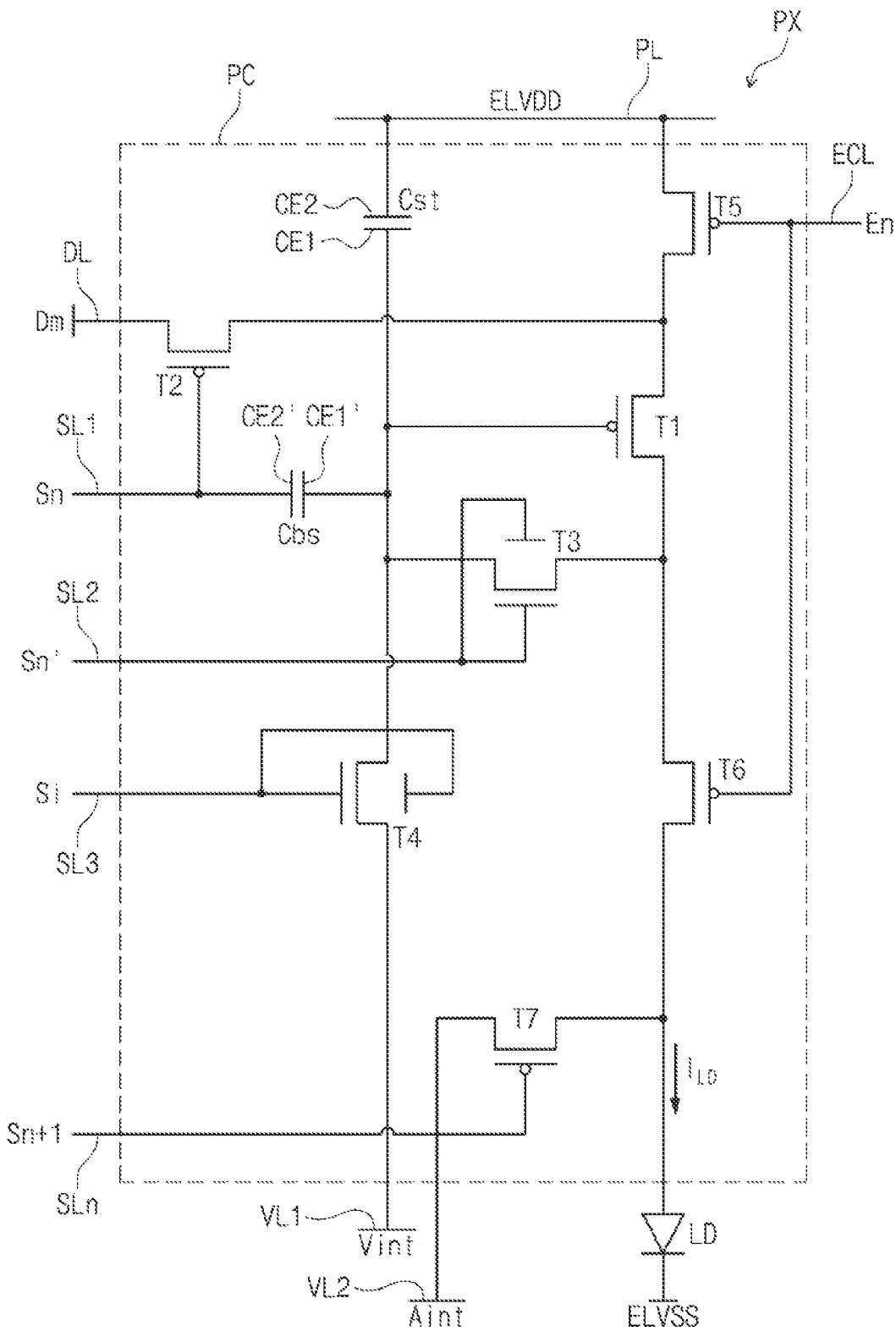
FIG. 6 is an equivalent circuit diagram of one of pixels according to an embodiment of the inventive concept.

FIG. 6 is an equivalent circuit diagram of one of pixels according to an embodiment of the inventive concept.

Referring to FIG. 6, an equivalent circuit diagram of one of the pixels PX is illustrated. The pixel PX illustrated in FIG. 6 may be the first red pixel PX11, the first green pixel PX12, the first blue pixel PX13, the second red pixel PX21, the second green pixel PX22, or the second blue pixel PX23.

The pixel PX may include the light emitting element LD and a pixel circuit PC. The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SL3, SLn, EL, and DL, a first initialization voltage line VL1, a second initialization voltage line VL2 (or an anode initialization voltage line), and the driving voltage line PL. In an embodiment, at least one of the above-described lines, for example, the driving voltage line PL may be shared with neighboring pixels PX.

The plurality of thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The light emitting element LD may include a first electrode (e.g., an anode electrode or a pixel electrode) and a second electrode (e.g., a cathode electrode or a common electrode), and the first electrode of the light emitting element LD may be connected to the driving thin film transistor T1 through the emission control thin film transistor T6 to receive a driving current $I_{LD}$, and the second electrode may receive a low power supply voltage ELVSS. The light emitting element LD may generate light having luminance corresponding to the driving current $I_{LD}$.

Some of the plurality of thin film transistors T1 to T7 may be provided as n-channel MOSFET (NMOS) and the others may be provided as p-channel MOSFET (PMOS). For example, the compensation thin film transistor T3 and the first initialization thin film transistor T4 among the plurality of thin film transistors T1 to T7 may be provided as n-channel MOSFET (NMOS), and the others may be provided as p-channel MOSFET (PMOS).

In another embodiment, a compensation thin film transistor T3, a first initialization thin film transistor T4, and a second initialization thin film transistor T7 among a plurality of thin film transistors T1 to T7 may be provided as NMOS and the rest of the plurality of thin film transistors T1 to T7 may be provided as PMOS. Alternatively, only one of the plurality of thin film transistors T1 to T7 may be provided as NMOS and the rest of the plurality of thin film transistors T1 to T7 may be provided as PMOS. Alternatively, all of the plurality of thin film transistors T1 to T7 may be provided as NMOS, or all thereof may be provided as PMOS.

The signal lines may include a first scan line SL1 transmitting a first scan signal Sn to the switching thin film transistor T2, a second scan line SL2 transmitting a second scan signal Sn' to the compensation thin film transistor T3, a third scan line SL3 transmitting a third scan signal S1 to the first initialization thin film transistor T4, an emission control line ECL transmitting an emission control signal En to the operation control thin film transistor T5 and the emission control thin film transistor T6, a next scan line SLn transmitting a next scan signal Sn+1 to the second initialization thin film transistor T7, and a data line DL that crosses the first scan line SL1 and transmits a data signal Dm. The first scan signal Sn may be a current scan signal, and the next scan signal Sn+1 may be a next scan signal of the first scan signal Sn.

The driving voltage line PL may transmit a driving voltage ELVDD to the driving thin film transistor T1, and the first initialization voltage line VL1 may transmit an initialization voltage Vint for initializing the driving thin film transistor T1. The second initialization voltage line VL2 may transmit an anode initialization voltage Aint for initializing the pixel electrode.

A driving gate electrode of the driving thin film transistor T1 may be connected to the storage capacitor Cst, a driving source region of the driving thin film transistor T1 may be connected to the driving voltage line PL via the operation control thin film transistor T5, and a driving drain region of the driving thin film transistor T1 may be electrically connected to the first electrode of the light emitting element LD via the emission control thin film transistor T6. The driving thin film transistor T1 may receive the data signal Dm in response to the switching operation of the switching thin film transistor T2 to supply the driving current $I_{LD}$ to the light emitting element LD.

A switching gate electrode of the switching thin film transistor T2 may be connected to the first scan line SL1 transmitting the first scan signal Sn, a switching source region of the switching thin film transistor T2 may be connected to the data line DL, and a switching drain region of the switching thin film transistor T2 may be connected to the driving source region of the driving thin film transistor T1 and connected to the driving voltage line PL via the operation control thin film transistor T5. The switching thin film transistor T2 may perform a switching operation in which the switching thin film transistor T2 is turned on in response to the first scan signal Sn transmitted through the first scan line SL1 and transmits the data signal Dm transmitted through the data line DL to the driving source region of the driving thin film transistor T1.

A compensation gate electrode of the compensation thin film transistor T3 is connected to the second scan line SL2. A compensation drain region of the compensation thin film transistor T3 may be connected to the driving drain region of the driving thin film transistor T1 and may be connected to the pixel electrode of the light emitting element LD via the emission control thin film transistor T6. A compensation source region of the compensation thin film transistor T3 may be connected to a first electrode CE1 of the storage capacitor Cst and the driving gate electrode of the driving thin film transistor T1. In addition, the compensation source region may be connected to a first initialization drain region of the first initialization thin film transistor T4.

The compensation thin film transistor T3 may be turned on in response to the second scan signal Sn' received through the second scan line SL2 and may electrically connect the driving gate electrode and the driving drain region of the driving thin film transistor T1 to diode-connect the driving thin film transistor T1.

A first initialization gate electrode of the first initialization thin film transistor T4 may be connected to the third scan line SL3. A first initialization source region of the first initialization thin film transistor T4 may be connected to the first initialization voltage line VL1. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned on in response to the third scan signal Si received through the third scan line SL3 and may perform an initialization operation in which the first initialization thin film transistor T4 allows the initialization voltage Vint to be transmitted to the driving gate electrode of the driving thin film transistor T1 and initializes the voltage of the driving gate electrode of the driving thin film transistor T1.

An operation control gate electrode of the operation control thin film transistor T5 may be connected to the emission control line ECL, an operation control source region of the operation control thin film transistor T5 may be connected to the driving voltage line PL, and an operation control drain region of the operation control thin film transistor T5 may be connected to the driving source region of the driving thin film transistor T1 and the switching drain region of the switching thin film transistor T2.

An emission control gate electrode of the emission control thin film transistor T6 may be connected to the emission control line ECL, an emission control source region of the emission control thin film transistor T6 may be connected to the driving drain region of the driving thin film transistor T1 and the compensation drain region of the compensation thin film transistor T3, and an emission control drain region of the emission control thin film transistor T6 may be electrically connected to a second initialization drain region of the second initialization thin film transistor T7 and the pixel electrode of the light emitting element LD.

The operation control thin film transistor T5 and the emission control thin film transistor T6 are simultaneously turned on in response to the emission control signal En received through the emission control line ECL and allow the driving voltage ELVDD to be applied to the light emitting element LD for the driving current $I_{LD}$ to flow through the light emitting element LD.

A second initialization gate electrode of the second initialization thin film transistor T7 may be connected to the next scan line SLn, the second initialization drain region of the second initialization thin film transistor T7 may be connected to the emission control drain region of the emission control thin film transistor T6 and the pixel electrode of the light emitting element LD, and the second initialization source region of the second initialization thin film transistor T7 may be connected to the second initialization voltage line VL2 to receive an anode initialization voltage Aint. The second initialization thin film transistor T7 is turned on in response to the next scan signal Sn+1 transmitted through the next scan line SLn and initializes the pixel electrode of the light emitting element LD.

In another embodiment, a second initialization thin film transistor T7 may be connected to an emission control line ECL to be driven in response to an emission control signal En. Meanwhile, positions of the source regions and the drain regions may be interchanged according to the type (p-type or n-type) of the transistors.

The storage capacitor Cst may include the first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. The storage capacitor Cst may store an electric charge corresponding to a difference between a voltage of the driving gate electrode of the driving thin film transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may compensate for the voltage drop of a gate terminal of the driving thin film transistor T1 by increasing the voltage of the gate terminal at the point in time when the provision of the first scan signal Sn is stopped.

A detailed operation of each of the pixels PX according to an embodiment is as follows.

When the third scan signal Si is provided through the third scan line SL3 during an initialization period, the first initialization thin film transistor T4 is turned on in response to the third scan signal Si, and the driving thin film transistor T1 is initialized by the initialization voltage Vint provided from the first initialization voltage line VL1.

When the first scan signal Sn and the second scan signal Sn' are provided through the first scan line SL1 and the second scan line SL2, respectively, during a data programming period, the switching thin film transistor T2 and the compensation thin film transistor T3 are turned on in response to the first scan signal Sn and the second scan signal Sn', respectively. At this time, the driving thin film transistor T1 is diode-connected by the turned-on compensation thin film transistor T3 and is forward-biased.

A threshold voltage of the driving thin film transistor T1 is referred to as a Vth. Then, a compensation voltage Dm+Vth obtained by adding the data signal Dm provided from the data line DL and a threshold voltage Vth (Vth is a negative value) of the driving thin film transistor T1 is applied to the driving gate electrode of the driving thin film transistor T1.

The driving voltage ELVDD and the compensation voltage Dm+Vth are respectively applied to both ends of the storage capacitor Cst, and an electric charge corresponding to a voltage difference between the both ends is stored in the storage capacitor Cst.

During an emission period, the operation control thin film transistor T5 and the emission control thin film transistor T6 are turned on by the emission control signal En provided from the emission control line ECL. The driving current $I_{LD}$ is generated according to a voltage difference between the voltage of the driving gate electrode of the driving thin film transistor T1 and the driving voltage ELVDD, and the driving current $I_{LD}$ is provided to the light emitting element LD through the emission control thin film transistor T6.

In this embodiment, at least one of the plurality of thin film transistors T1 to T7 includes a semiconductor layer including oxide, and the others include a semiconductor layer including silicon.

Specifically, the driving thin film transistor T1, which directly affects the brightness of the display device, may be formed to include a semiconductor layer formed of polycrystalline silicon having high reliability, thereby realizing a high-resolution display device.

Meanwhile, due to high carrier mobility and a low leakage current, the voltage drop of an oxide semiconductor is not large even when the driving time is long. That is, the oxide semiconductor is capable of low-frequency driving because the color change of an image caused by the voltage drop is not large even during the low-frequency driving.

As described above, because the oxide semiconductor has an advantage of a low leakage current, it is possible to prevent a leakage current that may flow into the driving gate electrode and simultaneously, to reduce power consumption by employing the oxide semiconductor for at least one of the compensation thin film transistor T3 and the first initialization thin film transistor T4 that are connected to the driving gate electrode of the driving thin film transistor T1.

Figure 8A:
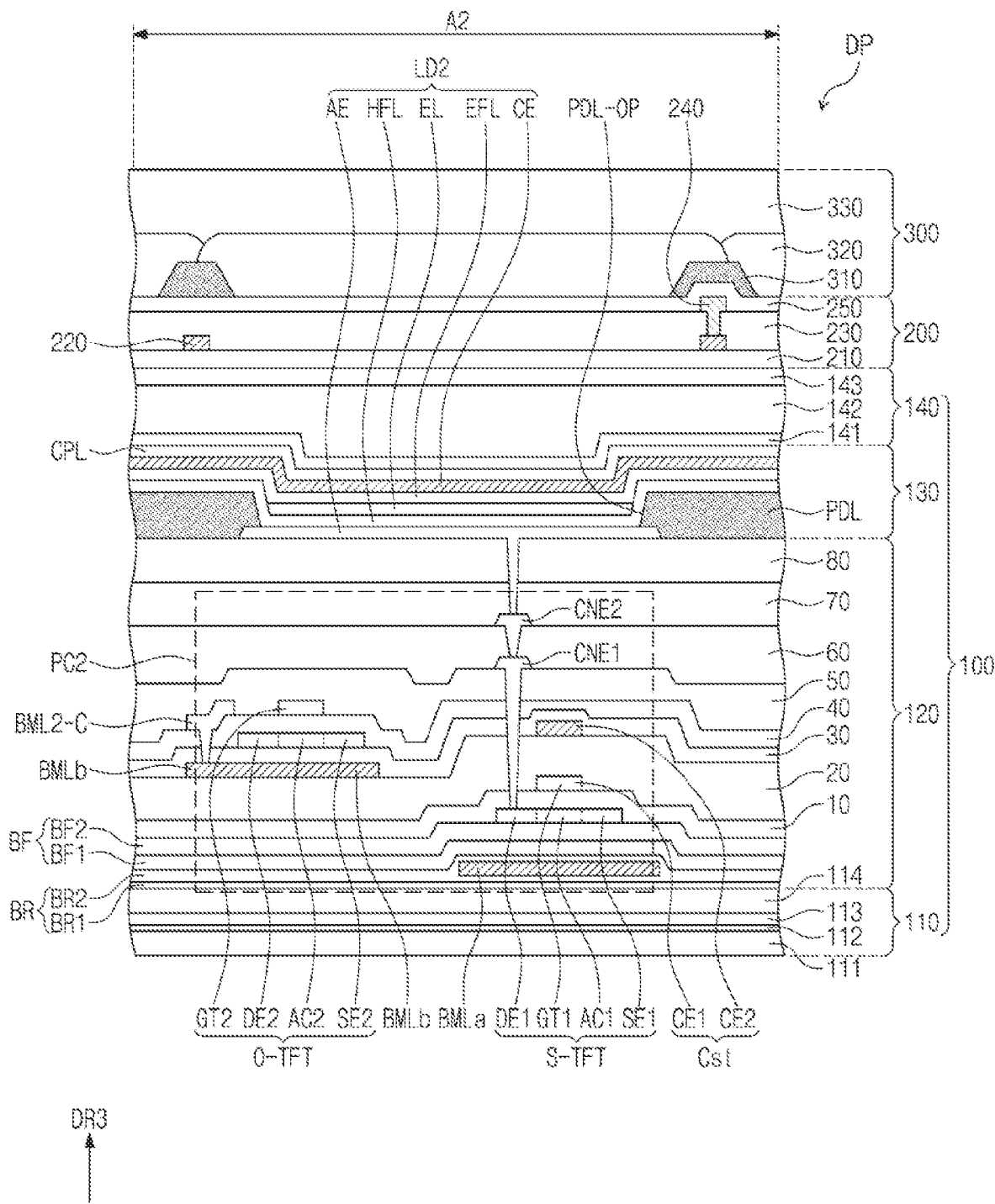
FIG. 8A is a cross-sectional view illustrating a second region of a display panel according to an embodiment of the inventive concept.

FIG. 7 is a cross-sectional view illustrating the first region A1 of the display panel DP according to an embodiment of the inventive concept. FIG. 8A is a cross-sectional view illustrating a second region A2 of the display panel DP according to an embodiment of the inventive concept.

Referring to FIGS. 7 and 8, the display panel DP may include a display layer 100, a sensor layer 200, and an anti-reflection layer 300. The display layer 100 may include a substrate 110, a circuit layer 120, a light emitting element layer 130, and an encapsulation layer 140.

The substrate 110 may include a plurality of layers 111, 112, 113, and 114. For example, the substrate 110 may include a first sub-base layer 111, a first intermediate barrier layer 112, a second intermediate barrier layer 113, and a second sub-base layer 114. The first sub-base layer 111, the first intermediate barrier layer 112, the second intermediate barrier layer 113, and the second sub-base layer 114 may be sequentially laminated in the third direction DR3.

Each of the first sub-base layer 111 and the second sub-base layer 114 may include at least one of polyimide-based resin, acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. In this specification, meanwhile, " . . . "-based resin means that the " . . . "-based resin includes a functional group of " . . . ".

A barrier layer BR may be disposed on the substrate 110. The barrier layer BR may include a first sub-barrier layer BR1 disposed on the substrate 110 and a second sub-barrier layer BR2 disposed on the first sub-barrier layer BR1.

Each of the first and second intermediate barrier layers 112 and 113 and the first and second sub-barrier layers BR1 and BR2 may include an inorganic material. Each of the first and second intermediate barrier layers 112 and 113 and the first and second sub-barrier layers BR1 and BR2 may include at least one of silicon oxide, silicon nitride, silicon oxynitride, or amorphous silicon. For example, each of the first and second sub-base layers 111 and 114 may include polyimide having a refractive index of about 1.9. The first intermediate barrier layer 112 and the first sub-barrier layer BR1 may include silicon oxynitride (SiON) having a refractive index of about 1.72. The second intermediate barrier layer 113 and the second sub-barrier layer BR2 may include silicon oxide (SiOx) having a refractive index of about 1.5.

That is, the refractive index of the first intermediate barrier layer 112 may have a value between the refractive index of the first sub-base layer 111 and the refractive index of the second intermediate barrier layer 113. The refractive index of the first sub-barrier layer BR1 may have a value between the refractive index of the second sub-base layer 114 and the refractive index of the second sub-barrier layer BR2. As a difference in refractive index between adjoining layers decreases, reflection at an interface between the adjoining layers may be reduced. As a result, the degree of transmission of light passing through the transmission regions TP may be improved.

The first sub-base layer 111 may be thicker than the second sub-base layer 114. For example, a thickness of the first sub-base layer 111 may be about 100,000 angstroms and a thickness of the second sub-base layer 114 may be about 56,000 angstroms. However, the thickness of each of the first and second sub-base layers 111 and 114 is not limited to the above-described value.

The first intermediate barrier layer 112 may be thinner than the second intermediate barrier layer 113, and the first sub-barrier layer BR1 may be thinner than the second sub-barrier layer BR2. For example, a thickness of the first intermediate barrier layer 112 may be about 1,000 angstroms, a thickness of the second intermediate barrier layer 113 may be about 5,000 angstroms, a thickness of the first sub-barrier layer BR1 may be about 1,000 angstroms, and a thickness of the second sub-barrier layer BR2 may be about 4,000 angstroms. However, the thickness of each of the first and second intermediate barrier layers 112 and 113 and the first and second sub-barrier layers BR1 and BR2 is not limited to the above-described value.

The light blocking layer BML may be disposed on the barrier layer BR. The light blocking layer BML may be disposed to overlap the first region A1 and may not be disposed in the second region A2. The light blocking layer BML may have a first opening BM-OP defining the transmission region TP. The light blocking layer BML may be a pattern serving as a mask when an electrode opening CE-OP is formed in a common electrode CE. For example, light radiated from a rear surface of the substrate 110 toward the common electrode CE may pass through the first opening BM-OP of the light blocking layer BML to reach a portion of each of the common electrode CE and a capping layer CPL. That is, the portion of each of the common electrode CE and the capping layer CPL may be removed by the light that has passed through the first opening BM-OP of the light blocking layer BML. The light may be a laser beam.

The light blocking layer BML may include molybdenum (Mo), an alloy containing molybdenum, silver (Ag), an alloy containing silver, aluminum (Al), an alloy containing aluminum, aluminum nitride (AlN), tungsten (W), tungsten nitride (WN), copper (Cu), titanium (Ti), p+ doped amorphous silicon, MoTaOx, and the like, but the light blocking layer BML is not particularly limited thereto. The light blocking layer BML may be referred to as a back metal layer or a back layer.

The light blocking layer BML may be connected to an electrode or a line to receive a constant voltage or a signal therefrom. For example, the light blocking layer BML may receive the initialization voltage Vint (see, FIG. 6). However, an embodiment of the inventive concept is not limited thereto, the light blocking layer BML may receive the anode initialization voltage Aint (see FIG. 6), the low power supply voltage ELVSS (see, FIG. 6), or the driving voltage ELVDD (see FIG. 6). In another embodiment, a light blocking layer BML may be provided in a form isolated from other electrodes or lines. As a constant voltage is applied to the light blocking layer BML, it is possible to prevent an electric potential due to a polarization phenomenon of the first sub-base layer 111 or the second sub-base layer 114 from affecting the first pixel circuit PC1.

In the first region A1, a region overlapping the first opening BM-OP may be defined as the transmission region TP, and the remaining region may be defined as an element region EP. Each of the plurality of first pixels PX11, PX12, and PX13 (see FIG. 5) may be disposed in the element region EP and may be spaced apart from the transmission region TP.

At least one lower insulating layer BMB may be disposed between the light blocking layer BML and the barrier layer BR. A lower insulating layer opening ML-OP overlapping the first opening BM-OP may be defined in the at least one lower insulating layer BMB. The first opening BM-OP and the lower insulating layer opening ML-OP may be simultaneously formed through the same process. For example, a sidewall BL-OPS of lower insulating layer BMB may protrude more than a sidewall of BM-OPS of the light blocking layer BML. (see FIG. 9.) Accordingly, a portion of the upper surface of the lower insulating layer BMB may not be covered by the light blocking layer BML.

A first pixel circuit PC1 may be spaced apart from the first opening BM-OP of the light blocking layer BML and the second opening BL-OP of the lower insulating layer BMB. That is, in a plan view, the first pixel circuit PC1 may not overlap each of the first opening BM-OP of the light blocking layer BML and the second opening BL-OP of the lower insulating layer BMB.

The at least one lower insulating layer BMB may include a first lower insulating layer BL1 disposed between the barrier layer BR and the light blocking layer BML and a second lower insulating layer BL2 disposed between the first lower insulating layer BL1 and the barrier layer BR.

Each of the first and second lower insulating layers BL1 and BL2 may include an inorganic material. For example, each of the first and second lower insulating layers BL1 and BL2 may include at least one of silicon oxide, silicon nitride, silicon oxynitride, or amorphous silicon. For example, the first lower insulating layer BL1 may include silicon oxide having a refractive index of about 1.5, and the second lower insulating layer BL2 may include amorphous silicon having a refractive index of about 1.7.

The refractive index of the first lower insulating layer BL1 and the refractive index of the second lower insulating layer BL2 may be different from each other. For example, the refractive index of the first lower insulating layer BL1 may be lower than that of the second lower insulating layer BL2 but is not particularly limited thereto. For example, the refractive index of the first lower insulating layer BL1 may be higher than that of the second lower insulating layer BL2.

As the first and second lower insulating layers BL1 and BL2 are sequentially disposed under the light blocking layer BML, reflection from the light blocking layer BML may be reduced. For example, light incident toward a rear surface of the light blocking layer BML or light reflected from the rear surface of the light blocking layer BML may destructively interfere in the first and second lower insulating layers BL1 and BL2. As a result, a probability that a noise image, e.g., a ghost phenomenon occurs in an image acquired from the camera module CMM (see FIG. 2A) may be reduced or eliminated. Accordingly, the quality of a signal obtained or received from the camera module CMM (see FIG. 2A) may be improved. The first and second lower insulating layers BL1 and BL2 may be respectively referred to as first and second noise prevention layers.

Figure 9:
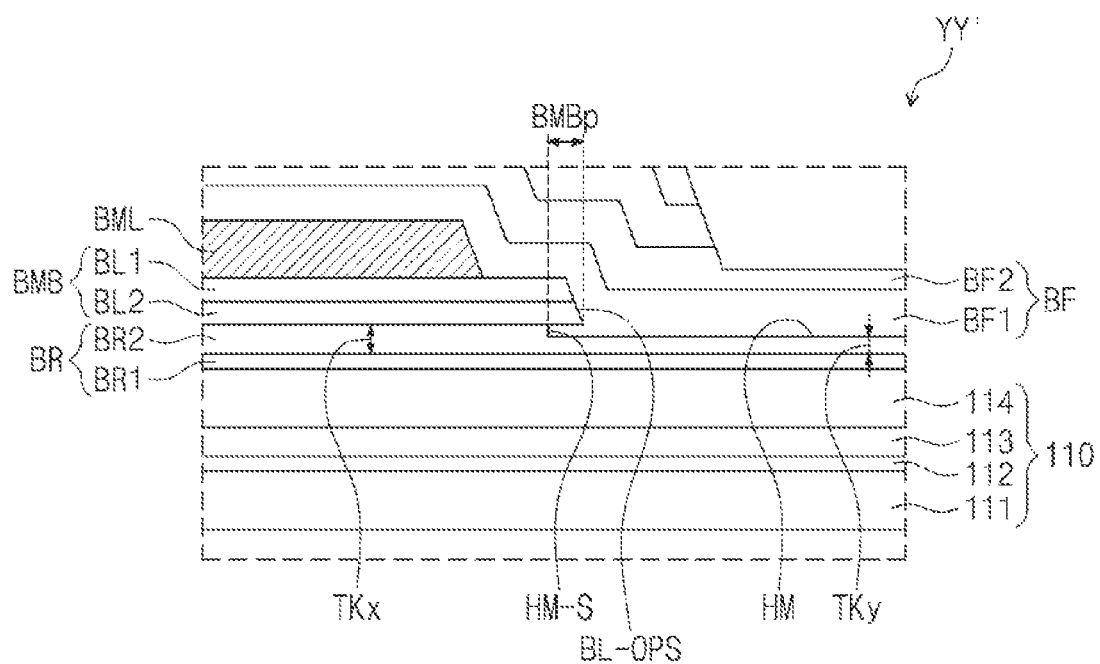
FIG. 9 is an enlarged plan view illustrating a region YY' illustrated in FIG. 7.

Although, in FIG. 9, two lower insulating layers, i.e., the first and second lower insulating layers BL1 and BL2 are illustrated as an example to be disposed under the light blocking layer BML, an embodiment of the inventive concept is not limited thereto. For example, the lower insulating layer BMB disposed under the light blocking layer BML may be constituted of one layer or may be constituted of three or more layers.

A thickness of the first lower insulating layer BL1 and a thickness of the second lower insulating layer BL2 may be the same. For example, each of the thicknesses of the first lower insulating layer BL1 and the second lower insulating layer BL2 may be about 130 angstroms but is not particularly limited thereto. In addition, the thicknesses of the first lower insulating layer BL1 and the second lower insulating layer BL2 may be different from each other.

A groove HM may be defined in a portion of the barrier layer BR. The groove HM may be provided in the transmission region TP, and the groove HM may overlap the first opening BM-OP and the second opening BL-OP. The groove HM may be provided by removing a portion of the barrier layer BR in the thickness direction, for example, in the third direction DR3. For example, a portion of the barrier layer BR in the thickness direction of the second sub-barrier layer BR2 may be removed to provide the groove HM. As the portion in the thickness direction of the barrier layer BR corresponding to the transmission region TP are removed, light transmittance of light transmitting the transmission region TP may be improved.

The sidewall BL-OPS of the lower insulating layer BMB may protrude more than the sidewall HM-S of the barrier layer BR defining the groove HM. (see FIG. 9.) In a plan view, the size of the groove HM may be larger than the size of the second opening BL-OP. A portion of the lower insulating layer BMB may overlap the groove HM, and a lower surface of a portion of the lower insulating layer BMB may not contact the barrier layer BR.

A buffer layer BF may be provided in both the first region A1 and the second region A2. The buffer layer BF may be disposed on the barrier layer BR and may cover the light blocking layer BML and the at least one lower insulating layer BMB disposed in the first region A1. The buffer layer BF may prevent metal atoms or impurities from diffusing from the substrate 110 into a first semiconductor pattern. In addition, the buffer layer BF may adjust a thermal conductivity of the first semiconductor pattern during a crystallization process for forming the first semiconductor pattern, so that the first semiconductor pattern may be uniformly formed.

The buffer layer BF may cover the first opening BM-OP, the second opening BL-OP, and the groove HM and may overlap the transmission region TP. The buffer layer BF may include a first sub-buffer layer BF1 and a second sub-buffer layer BF2 disposed on the first sub-buffer layer BF1. Each of the first sub-buffer layer BF1 and the second sub-buffer layer BF2 may include at least one of silicon oxide, silicon nitride, or silicon oxynitride. For example, the first sub-buffer layer BF1 may include silicon nitride, and the second sub-buffer layer BF2 may include silicon oxide.

A portion of the second sub-buffer layer BF2 overlapping the transmission region TP may be removed. Accordingly, a thickness TKa of a portion of the second sub-buffer layer BF2 disposed in the element region EP may be greater than a thickness TKb of a portion of the second sub-buffer layer BF2 disposed in the transmission region TP. For example, the thickness TKb of the portion of the second sub-buffer layer BF2 disposed in the transmission region TP may be about 500 angstroms but is not particularly limited thereto.

Each of the plurality of first pixels PX11, PX12, and PX13 (see FIG. 5) may include a first light emitting element LD1 and the first pixel circuit PC1, and each of the plurality of second pixels PX21, PX22, and PX23 may include a second light emitting element LD2 and the second pixel circuit PC2. The first light emitting element LD1 may be disposed in the element region EP, and the second light emitting element LD2 may be disposed in the second region A2.

FIG. 7 is a cross-sectional view of a portion of the first light emitting element LD1 and the first pixel circuit PC1 disposed in the first region A1, and FIG. 8A is a cross-sectional view of a portion of the second light emitting element LD2 and the second pixel circuit PC2 disposed in the second region A2. In addition, a silicon thin film transistor S-TFT and an oxide thin film transistor O-TFT of the second pixel circuit PC2 are illustrated in FIG. 8A.

Referring to FIG. 8A, a first light blocking layer BMLa may be disposed under the silicon thin film transistor S-TFT and a second light blocking layer BMLb may be disposed under the oxide thin film transistor O-TFT. Each of the first light blocking layer BMLa and the second light blocking layer BMLb may be disposed to overlap the second pixel circuit PC2 to protect the second pixel circuit PC2. The first light blocking layer BMLa and the second light blocking layer BMLb may not be disposed in the first region A1.

The first and second light blocking layers BMLa and BMLb may block an electric potential due to polarization of the first sub-base layer 111 or the second sub-base layer 114 from affecting the second pixel circuit PC2. In an embodiment of the inventive concept, the second light blocking layer BMLb may be omitted.

The first light blocking layer BMLa may be surrounded by the second sub-barrier layer BR2. For example, after a portion of the second sub-barrier layer BR2 is formed, the first light blocking layer BMLa may be formed, and a second portion of the second sub-barrier layer BR2 may cover the first light blocking layer BMLa. The first light blocking layer BMLa may be referred to as a rear light blocking layer.

The second light blocking layer BMLb may be disposed between the second insulating layer 20 and a third insulating layer 30. The second light blocking layer BMLb may be disposed on the same layer as the second electrode CE2 of the storage capacitor Cst. The second light blocking layer BMLb may be connected to a contact electrode BL2-C to receive a constant voltage or a signal. The contact electrode BL2-C may be disposed on the same layer as a gate GT2 of the oxide thin film transistor O-TFT. Each of the first and second light blocking layers BMLa and BMLb may include the same material as the light blocking layer BML or may include a material different from that of the light blocking layer BML.

The first light blocking layer BMLa and the second light blocking layer BMLb each may be connected to an electrode or a line to receive a constant voltage or a signal therefrom. The voltage or the signal respectively applied to the first light blocking layer BMLa and the second light blocking layer BMLb may be different from the voltage or the signal applied to the light blocking layer BML. For example, the first light blocking layer BMLa may receive the driving voltage ELVDD (see FIG. 6). Alternatively, the voltage or the signal respectively applied to the first light blocking layer BMLa and the second light blocking layer BMLb may be the same as the voltage or the signal applied to the light blocking layer BML. In another embodiment, a first light blocking layer BMLa and a second light blocking layer BMLb each may be provided in a form isolated from other electrodes or lines.

The first semiconductor pattern may be disposed on the buffer layer BF. The first semiconductor pattern may include a silicon semiconductor. For example, the silicon semiconductor may include amorphous silicon, polycrystalline silicon, and the like. For example, the first semiconductor pattern may include low-temperature polysilicon.

FIG. 7 and FIG. 8A illustrate only a portion of the first semiconductor pattern disposed on the buffer layer BF, and another portion of the first semiconductor pattern may be further disposed in another region. The first semiconductor pattern may be arranged in a specific rule across the pixels. The first semiconductor pattern may have different electrical properties depending on whether the same is doped. The first semiconductor pattern may include a first region having a high conductivity and a second region having a low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped in a lower concentration than the first region.

Conductivity of the first region may be higher than that of the second region, and the first region may substantially serve as an electrode or a signal line. The second region may substantially correspond to an active region (or a channel) of the transistor. In other words, a portion of the first semiconductor pattern may be the active region of the transistor, another portion may be a source or a drain of the transistor, and another portion may be a connection electrode or a connection signal line.

A source region SE1, an active region AC1, and a drain region DE1 of the silicon thin film transistor S-TFT may be formed from the first semiconductor pattern. The source region SE1 and the drain region DE1 may respectively extend in opposite directions from the active region AC1 when viewed in the cross section.

The first insulating layer 10 may be disposed on the buffer layer BF. The first insulating layer 10 may overlap the plurality of pixels in common and may cover the first semiconductor pattern. The first insulating layer 10 may be an inorganic layer and/or an organic layer and may have a single-layer structure or a multilayer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. In addition to the first insulating layer 10, each of the insulating layers of the circuit layer 120 to be described later may be an inorganic layer and/or an organic layer, and may have a single-layer structure or a multilayer structure. The inorganic layer may include at least one of the above-described materials, but is not limited thereto.

A gate GT1 of the silicon thin film transistor S-TFT is disposed on the first insulating layer 10. The gate GT1 may be a portion of a metal pattern. The gate GT1 overlaps the active region AC1. In a process of doping the first semiconductor pattern, the gate GT1 may function as a self-aligned mask. Although the gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like, the material forming the gate GT1 is not particularly limited thereto.

The second insulating layer 20 may be disposed on the first insulating layer 10 and may cover the gate GT1. The second insulating layer 20 may be an inorganic layer and may have a single-layer structure or a multilayer structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

The third insulating layer 30 may be disposed on the second insulating layer 20. The third insulating layer 30 may have a single-layer structure or a multilayer structure. For example, the third insulating layer 30 may have a multilayer structure including a silicon oxide layer and a silicon nitride layer. The second electrode CE2 of the storage capacitor Cst may be disposed between the second insulating layer 20 and the third insulating layer 30. In addition, the first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include a plurality of regions which include a reduction region and a non-reduction region. A region in which the metal oxide is reduced (the reduction region) has a higher conductivity than a region in which the metal oxide is not reduced (the non-reduction region). The reduction region substantially serves as a source/drain of the transistor or a signal line. The non-reduction region substantially corresponds to the active region (or a semiconductor region or the channel) of the transistor. In other words, one portion of the second semiconductor pattern may be the active region of the transistor, the other portion may be the source/drain region of the transistor, and another portion may be a signal transmission region.

A source region SE2, an active region AC2, and a drain region DE2 of the oxide thin film transistor O-TFT may be formed from the second semiconductor pattern. The source region SE2 and the drain region DE2 may respectively extend in opposite directions from the active region AC2 in a cross section.

The fourth insulating layer 40 may be disposed on the third insulating layer 30. The fourth insulating layer 40 may overlap the plurality of pixels in common and may cover the second semiconductor pattern. The fourth insulating layer 40 may include at least one of aluminum oxide, titanium oxide, silicon oxide, silicon nitride, silicon oxynitride, zirconium oxide, or hafnium oxide.

The gate GT2 of the oxide thin film transistor O-TFT is disposed on the fourth insulating layer 40. The gate GT2 may be a portion of a metal pattern. The gate GT2 overlaps the active region AC2. In a process of doping the second semiconductor pattern, the gate GT2 may function as a self-aligned mask.

The fifth insulating layer 50 may be disposed on the fourth insulating layer 40 and may cover the gate GT2. The fifth insulating layer 50 may be an inorganic layer and/or an organic layer and may have a single-layer structure or a multilayer structure.

A first connection electrode CNE1 may be disposed on the fifth insulating layer 50. The first connection electrode CNE1 may be connected to the drain region DE1 of the silicon thin film transistor S-TFT through a contact hole formed through the first to fifth insulating layers 10, 20, 30, 40, and 50.

Referring to FIG. 7, a third opening IL-OP may be defined in the buffer layer BF and at least some of the plurality of insulating layers 10, 20, 30, 40, and 50 and a plurality of insulating layers 60, 70, and 80 included in the circuit layer 120. For example, the third opening IL-OP may be defined in a portion in a thickness direction of the second sub-buffer layer BF2 and in the first to fifth insulating layers 10, 20, 30, 40, and 50. The third opening IL-OP may be defined in a region overlapping the transmission region TP. That is, as the portion in the thickness direction of the second sub-buffer layer BF2 and a portion of each of the first to fifth insulating layers 10, 20, 30, 40, and 50 overlapping the transmission region TP are removed, the light transmittance of the transmission region TP may be improved.

A minimum width of the third opening IL-OP may be smaller than a minimum width of the first opening BM-OP. A sidewall IL-OPS of the second sub-buffer layer BF2 and the first to fifth insulating layers 10, 20, 30, 40, and 50 defining the third opening IL-OP may protrude more than the sidewall BM-OPS of the light blocking layer BML.

The sixth insulating layer 60 may be disposed on the fifth insulating layer 50. The sixth insulating layer 60 may include an organic material and may include, for example, polyimide-based resin. The second connection electrode CNE2 may be disposed on the sixth insulating layer 60. The second connection electrode CNE2 may be connected to the first connection electrode CNE1 through a contact hole formed through the sixth insulating layer 60.

The sixth insulating layer 60 may cover the third opening IL-OP. That is, the sixth insulating layer 60 may overlap the transmission region TP. As the sixth insulating layer 60 is provided in the transmission region TP, a step formed by components disposed below the sixth insulating layer 60 may be reduced. When the step formed by components disposed below the sixth insulating layer 60 is reduced, diffraction of light incident on the transmission region TP may be alleviated (or reduced). Accordingly, image distortion due to the diffraction is reduced, and thus the quality of an image obtained from the camera module CMM (see FIG. 2A) may be enhanced.

In addition, the light transmittance of the transmission region TP may be controlled by adjusting the thickness of the sixth insulating layer 60. The thickness of the sixth insulating layer 60 is about 15,000 angstroms, and thus the thickness thereof may be more easily controlled than thicknesses of other thin insulating layers of several to hundreds of angstroms. Accordingly, as variance of transmittance distribution for electronic devices is reduced, and process management may become easier.

In addition, as the sixth insulating layer 60 is provided, it is possible to secure the thickness uniformity of the seventh insulating layer 70, the eighth insulating layer 80, and the pixel defining film PDL that are disposed on the sixth insulating layer 60.

The seventh insulating layer 70 may be disposed on the sixth insulating layer 60 and may cover the second connection electrode CNE2. The eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include benzocyclobutene (BCB), polyimide, hexamethyldisiloxane (HMDSO), a general-purpose polymer such as polymethylmethacrylate (PMMA) and polystyrene (PS), a polymer derivative having a phenolic group, an acrylate-based polymer, an imide-based polymer, an arylether-based polymer, an amide-based polymer, a fluorine-based polymer, a p-xylene-based polymer, a vinyl alcohol-based polymer, blends thereof, and the like.

The light emitting element layer 130 including the first and second light emitting elements LD1 and LD2 may be disposed on the circuit layer 120. Each of the first and second light emitting elements LD1 and LD2 may include a pixel electrode AE, a first functional layer HFL, a light emitting layer EL, a second functional layer EFL, and the common electrode CE. The first functional layer HFL, the second functional layer EFL, and the common electrode CE may be formed in common throughout the pixels PX (see FIG. 4).

The pixel electrode AE may be disposed on the eighth insulating layer 80. The pixel electrode AE may be a (semi-)transmissive electrode or a reflective electrode. In an embodiment, the pixel electrode AE may include a reflective layer formed of Ag, Mg, Al, Pt, Pd, Au, Ni, Nd, Ir, Cr, or a compound thereof, and a transparent or translucent electrode layer formed on the reflective layer. The transparent or translucent electrode layer may include at least one selected from a group including indium tin oxide (ITO), indium zinc oxide (IZO), indium gallium zinc oxide (IGZO), zinc oxide (ZnO) or indium oxide ($In_2O_3$), and aluminum-doped zinc oxide (AZO). For example, the pixel electrode AE may be formed of ITO/Ag/ITO.

The pixel defining film PDL may be disposed on the eighth insulating layer 80. The pixel defining film PDL may have a property of absorbing light and may have, for example, a black color. The pixel defining film PDL may include a black coloring agent. The black coloring agent may include a black dye or a black pigment. The black coloring agent may include carbon black, a metal such as chromium, or oxide thereof.

An opening PDL-OP exposing a portion of the pixel electrode AE may be defined in the pixel defining film PDL. That is, the pixel defining film PDL may cover edges of the pixel electrode AE. In addition, the pixel defining film PDL may cover a side surface of the eighth insulating layer 80 adjacent to the transmission region TP.

The first functional layer HFL may be disposed on the pixel electrode AE and the pixel defining film PDL. The first functional layer HFL may include a hole transport layer HTL, a hole injection layer HIL, or both the hole transport layer HTL and the hole injection layer HIL. The first functional layer HFL may be disposed in the entirety of the first region A1 and the second region A2 and may also be disposed in the transmission region TP.

The light emitting layer EL may be disposed on the first functional layer HFL and may be disposed in a region corresponding to the opening PDL-OP of the pixel defining film PDL. The light emitting layer EL may include an organic material, an inorganic material, or an organic-inorganic material that emits light of a predetermined color. The light emitting layer EL may be disposed in the first region A1 and the second region A2. The light emitting layer EL disposed in the first region A1 may be disposed in a region spaced apart from the transmission region TP, that is, in the element region EP.

The second functional layer EFL may be disposed on the first functional layer HFL and may cover the light emitting layer EL. The second functional layer EFL may include an electron transport layer ETL, an electron injection layer EIL, or both the electron transport layer ETL and the electron injection layer EIL. The second functional layer EFL may be disposed in the entirety of the first region A1 and the second region A2 and may also be disposed in the transmission region TP.

The common electrode CE may be disposed on the second functional layer EFL. The common electrode CE may be disposed in the first region A1 and the second region A2. The opening CE-OP overlapping the first opening BM-OP may be defined in the common electrode CE. A minimum width of the opening CE-OP may be greater than the minimum width of the first opening BM-OP of the light blocking layer BML.

The light emitting element layer 130 may further include the capping layer CPL disposed on the common electrode CE. The capping layer CPL may include LiF, an inorganic material, and/or an organic material. A portion of the capping layer CPL overlapping the opening CE-OP of the common electrode CE may be removed. As the portion of the capping layer CPL including a portion overlapping the transmission region TP and a portion of the common electrode CE are removed, the light transmittance of the transmission region TP may be further improved.

The encapsulation layer 140 may be disposed on the light emitting element layer 130. The encapsulation layer 140 may include an inorganic layer 141, an organic layer 142, and an inorganic layer 143 sequentially laminated, but layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylate-based organic layer but is not limited thereto.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be directly disposed on the display layer 100. The sensor base layer 210 may be an inorganic layer including at least one of silicon nitride, silicon oxynitride, or silicon oxide. Alternatively, the sensor base layer 210 may be an organic layer including epoxy resin, acrylic resin, or imide-based resin. The sensor base layer 210 may have a single-layer structure or a multilayer structure laminated in the third direction DR3.

Each of the first sensor conductive layer 220 and the second sensor conductive layer 240 may have a single-layer structure or may have a multilayer structure laminated in the third direction DR3.

The conductive layer of the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), and indium zinc tin oxide (IZTO). In addition, the transparent conductive layer may include a conductive polymer such as PEDOT, metal nanowires, graphene, and the like.

The conductive layer of the multilayer structure may include metal layers. The metal layers may have, for example, a three-layer structure of titanium/aluminum/titanium. The conductive layer of the multilayer structure may include at least one metal layer and at least one transparent conductive layer.

The sensor insulating layer 230 may be disposed between the first sensor conductive layer 220 and the second sensor conductive layer 240. The sensor insulating layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensor insulating layer 230 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

The sensor cover layer 250 may be disposed on the sensor insulating layer 230 and may cover the second sensor conductive layer 240. The second sensor conductive layer 240 may include a conductive pattern 240P (see FIG. 5). The sensor cover layer 250 may cover the conductive pattern 240P (see FIG. 5) and may reduce or eliminate a probability of damage to the conductive pattern 240P in a subsequent process.

The sensor cover layer 250 may include an inorganic material. For example, the sensor cover layer 250 may include silicon nitride but is not particularly limited thereto.

The anti-reflection layer 300 may be disposed on the sensor layer 200. The anti-reflection layer 300 may include the partition layer 310, a plurality of color filters 320, and a planarization layer 330. The partition layer 310 and the color filters 320 are not disposed in the transmission region TP of the first region A1.

The partition layer 310 may be disposed to overlap the second sensor conductive layer 240 in a plan view. The sensor cover layer 250 may be disposed between the partition layer 310 and the second sensor conductive layer 240. The partition layer 310 may prevent reflection of external light by the second sensor conductive layer 240. A material constituting the partition layer 310 is not particularly limited as long as the material absorbs light. The partition layer 310 may be a layer having a black color and may include, in an embodiment, a black coloring agent. The black coloring agent may include a black dye or a black pigment. The black coloring agent may include carbon black, a metal such as chromium, or oxide thereof.

A plurality of partition openings 310OP and an opening 31-OP may be defined in the partition layer 310. The light emitting layer EL may be provided in plurality. The plurality of partition openings 310OP may respectively overlap the plurality of light emitting layers EL. The color filters 320 may be disposed to respectively correspond to the plurality of partition openings 310OP. Each of the color filters 320 may transmit light provided from the light emitting layer EL overlapping the color filter 320. The opening 31-OP of the partition layer 310 may overlap the first opening BM-OP of the light blocking layer BML. A minimum width of the opening 31-OP of the partition layer 310 may be greater than a width of the first opening BM-OP of the light blocking layer BML. In a region adjacent to the transmission portion TP, the end of the partition layer 310 may protrude more than the end of the pixel defining layer PDL. In a plan view, the end of the partition layer 310 may be disposed between the end of the pixel defining layer PDL and the end of the light blocking layer BML.

The planarization layer 330 may cover the partition layer 310 and the color filters 320. The planarization layer 330 may include an organic material and may provide a flat surface on a top surface of the planarization layer 330. In an embodiment, the planarization layer 330 may be omitted.

Figure 8B:
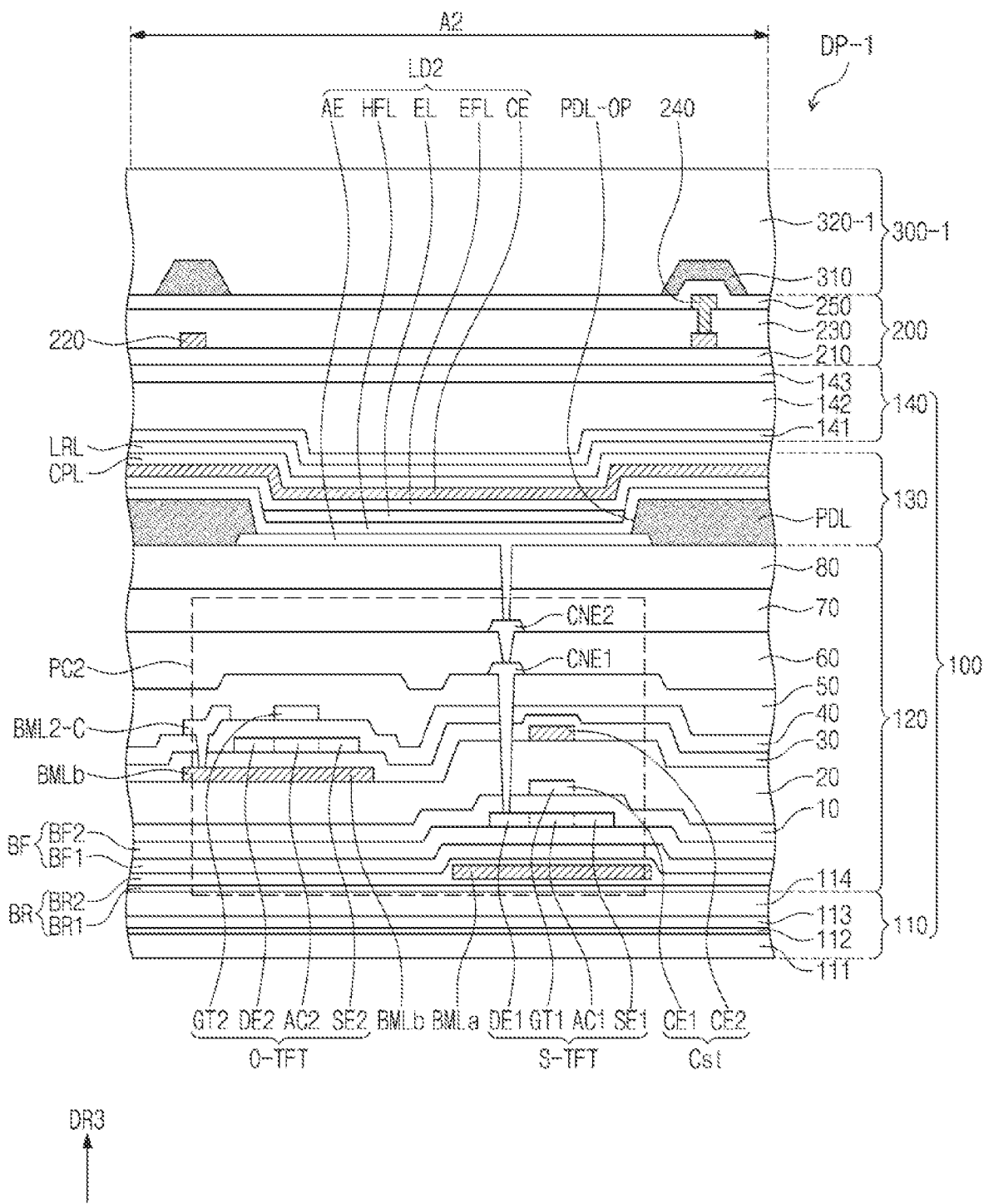
FIG. 8B is a cross-sectional view illustrating a second region of a display panel according to an embodiment of the inventive concept.

FIG. 8B is a cross-sectional view illustrating a second region A2 of a display panel DP-1 according to an embodiment of the inventive concept. In the following descriptions with reference to FIG. 8B, different features from those of FIG. 8A will be described. In FIG. 8B, the same reference numerals denote the same elements in FIG. 8A, and thus, detailed descriptions of the same elements may be omitted.

Referring to FIG. 8B, the display panel DP-1 may include the display layer 100-1, the sensor layer 200, and an anti-reflective layer 300-1. The display layer 100-1 may include a substrate 110, a circuit layer 120, a light emitting element layer 130, and an encapsulation layer 140.

The anti-reflective layer 300-1 may include a reflection control layer 320-1 on the division layer 310. The reflection control layer 320-1 may selectively absorb light of a certain band among pieces of light reflected from the inside of the display panel DP-1 and/or the electronic device or pieces of light incident from the outside of the display panel DP-1 and/or the electronic device.

For example, the reflection control layer 320-1 may absorb light of a first wavelength band of about 490 nm to about 505 nm and a second wavelength band of about 585 nm to about 600 nm, so that light transmittance of the light in the first wavelength band and the second wavelength band is about 40% or less. The reflection control layer 320-1 may absorb light of wavelengths out of the wavelength ranges of red light, green light, and blue light respectively emitted from the first display element, the second display element, and the third display element. Because the reflection control layer 320-1 absorbs light of wavelengths that do not belong to the wavelength ranges of the red light, the green light, and the blue light emitted from the display elements, the reduction in the luminance of the display panel DP-1 and/or the electronic device may be prevented or minimized. Also, the reduction in the luminescence efficiency of the display panel DP-1 and/or the electronic device may be prevented or minimized, and the visibility of the display panel DP-1 and/or the electronic device may be improved.

The reflection control layer 320-1 may include an organic material layer including a dye, a pigment, and/or any combination thereof. The reflection control layer 320-1 may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and/or any combination thereof.

In an embodiment, the reflection control layer 320-1 may have a transmittance of about 64% to about 72%. The transmittance of the reflection control layer 320-1 may be controlled according to the amount of the pigment and/or the dye included in the reflection control layer 320-1. The reflection control layer 320-1 overlaps the display elements in a plan view, but does not overlap the transmission area TP in a plan view. In a plan view, the transmission area TP may overlap the pixel definition layer PDL without overlapping the reflection control layer 320-1.

According to the embodiment including the reflection control layer 320-1, a low reflection layer LRL may be additionally between the capping layer CPL and the encapsulation layer 140.

Due to the principle of constructive interference, the capping layer CPL may improve the luminescence efficiency of the display element. The capping layer CPL may include, for example, a material having a refractive index of about 1.6 or greater for light having a wavelength of about 589 nm.

The capping layer CPL may be an organic capping layer including an organic material, an inorganic capping layer including an inorganic material, or a composite capping layer including an organic material and an inorganic material. For example, the capping layer CPL may include a carbocyclic compound, a heterocyclic compound, an amine group-containing compound, porphine derivatives, phthalocyanine derivatives, naphthalocyanine derivatives, an alkali metal complex, an alkaline earth metal complex, and/or any combination thereof. The carbocyclic compound, the heterocyclic compound, and the amine group-containing compound may optionally be substituted with substituents including O, N, S, Se, Si, F, Cl, Br, I, and/or any combination thereof.

The low reflection layer LRL may be on the capping layer CPL. The low reflection layer LRL may include an inorganic material having low reflectance. In an embodiment, the low reflection layer LRL may include a metal or a metal oxide. When the low reflection layer LRL includes a metal, the low reflection layer LRL may include, for example, ytterbium (Yb), bismuth (Bi), cobalt (Co), molybdenum (Mo), titanium (Ti), zirconium (Zr), aluminum (Al), chromium (Cr)), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or any combination thereof. Also, when the low reflection layer LRL includes a metal oxide, the low reflection layer LRL may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and/or any combination.

In an embodiment, the inorganic material included in the low reflection layer LRL may have an absorption coefficient (k) of greater than 0.5 and less than or equal to 4.0 ($0.5 < k \leq 4.0$). Also, the inorganic material included in the low reflection layer LRL may have a refractive index (n) of 1 or more ($n \geq 1.0$).

The low reflection layer LRL induces destructive interference between light incident on the display panel and/or the electronic device and light reflected from the metal below the low reflection layer LRL, so that external light reflectance may be reduced. Therefore, the display quality and visibility of the display panel and/or the electronic device may be improved.

In some embodiments, the capping layer CPL may be omitted and the low reflection layer LRL may be in contact with the common electrode CE.

FIG. 9 is an enlarged plan view illustrating the region YY' illustrated in FIG. 7.

Referring to FIGS. 7 and 9, the sidewall BL-OPS of the lower insulating layer BMB may protrude more than the sidewall HM-S of the barrier layer BR defining the groove HM. In a plan view, the size of the groove HM may be larger than the size of the second opening BL-OP. A portion BMBp of the lower insulating layer BMB may overlap the groove HM, and a lower surface of a portion BMBp of the lower insulating layer BMB may not contact the barrier layer BR.

A portion of the barrier layer BR in the thickness direction of the second sub-barrier layer BR2 may be removed to provide the groove HM. Accordingly, a first thickness TKx of a portion of the second sub-barrier layer BR2 disposed in the element region EP may be greater than a second thickness TKy of a portion of the second sub-barrier layer BR2 disposed in the transmission region TP. For example, the first thickness TKx may be about 4000 angstroms, and the second thickness TKy may be about 3900 angstroms. That is, the depth of the groove HM may be a level of about 100 angstroms. However, the above figures are merely examples, and an embodiment of the inventive concept is not limited thereto.

FIGS. 10A, 10B, 10C, and 10D are cross-sectional views illustrating a portion of a method for manufacturing a display panel.

Figure 10A:
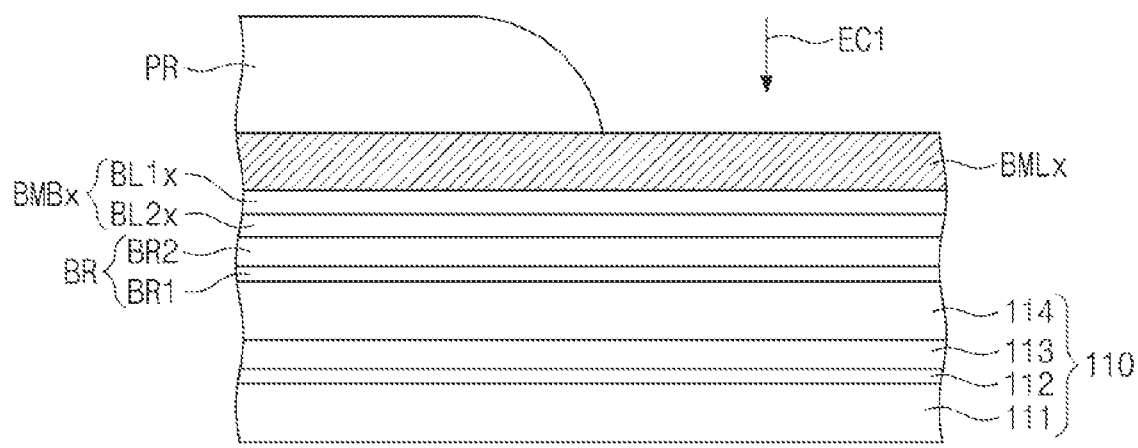
FIG. 10A, FIG. 10B, FIG. 10C, and FIG. 10D are cross-sectional views illustrating a portion of a method for manufacturing a display panel.

Referring to FIGS. 7 and 10A, a barrier layer BR is formed on the substrate 110. The barrier layer BR may include a silicon oxide layer. For example, the second sub-barrier layer BR2 of the barrier layer BR may be a silicon oxide layer.

A preliminary lower insulating layer BMBx is formed on the barrier layer BR. The forming of the preliminary lower insulating layer BMBx may include forming an amorphous silicon layer BL2x on the barrier layer BR and forming a silicon oxide layer BL1x on the amorphous silicon layer BL2x.

A preliminary light blocking layer BMLx is formed on the preliminary lower insulating layer BMBx. A photoresist pattern PR is formed on the preliminary light blocking layer BMLx. Thereafter, the preliminary light blocking layer BMLx and the preliminary lower insulating layer BMBx may be subjected to primary etching EC1. The primary etching EC1 may be dry etching. For example, gas gases such as $SF_6$ and $O_2$ may be used in the primary etching EC1.

Figure 10B:
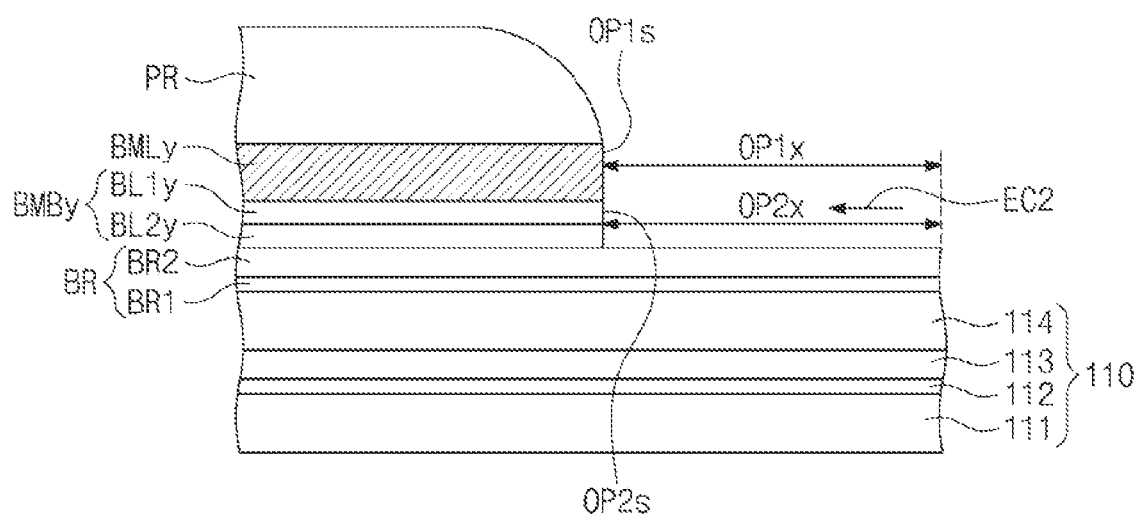

Referring to FIGS. 7 and 10B, a first opening OP1x may be formed in the preliminary light blocking layer BMLx and a second opening OP2x may be formed in the preliminary lower insulating layer BMBy by the primary etching EC1. The side surface OP1s of the first opening OP1x and the side surface OP2s of the second opening OP2x formed by the primary etching EC1 may be subjected to secondary etching EC2. The secondary etching EC2 may be dry etching. For example, gas gases such as $Cl_2$ and $O_2$ may be used in the secondary etching EC2.

Figure 10C:
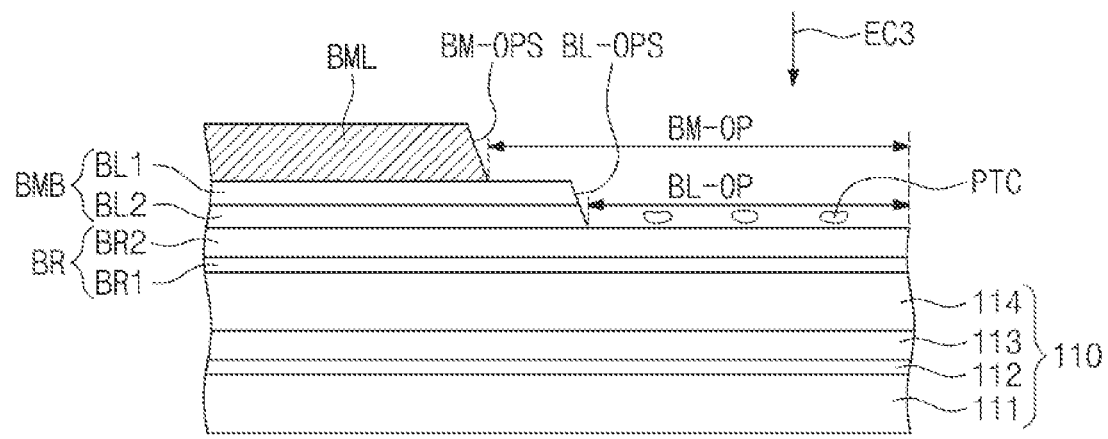
Figure 10D:
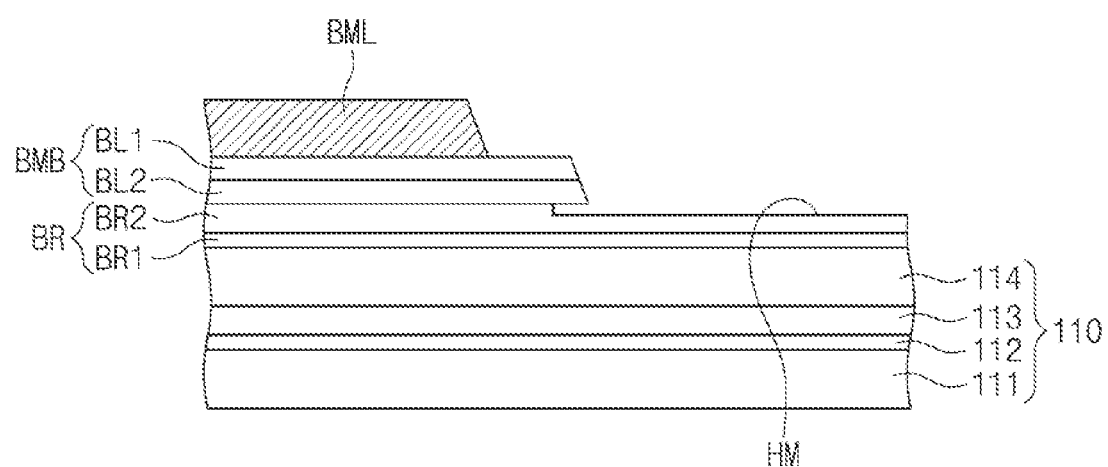

Referring to FIGS. 7 and 10C, an inclined side surface BM-OPS of light blocking layer BML and an inclined side surface BL-OPS of the lower insulating layer BMB may be formed. Thereafter, the photoresist pattern PR is removed.

Particles PTC may be generated in the process of forming the first opening BM-OP in the light blocking layer BML and the second opening BL-OP in the lower insulating layer BMB. The particles PTC may be byproducts generated during the primary etching EC1 and the secondary etching EC2.

According to an embodiment of the inventive concept, an additional etching process for removing particles PTC is provided. For example, the particles PTC may be removed by tertiary etching EC3. The tertiary etching EC3 may be wet etching using an etchant. The etchant may be a buffered oxide etchant BOE. For example, the etchant may be a mixture of $NH_4F$ and HF. The etchant may further include typical additives.

The particles PTC may be silicon oxide SiOx based, the particles PTC may be removed by the following reaction formula, and in the following reaction formula, $H_2SiF_6$ may be dissolved in water. As a result, since the particles PTC are removed by the tertiary etching EC3, the occurrence of defective pixels (such as white bright spot defects) caused by the particles PTC may be reduced or eliminated. In addition, as the particles are removed, the quality of a signal obtained or received from the camera module CMM (see FIG. 2A) may be improved.

Reaction formula: $SiO_2 + 6HF \rightarrow H_2SiF_6 + H_2O$

The second sub-barrier layer BR2 may be a silicon oxide layer. Accordingly, a portion in a thickness direction of the second sub-barrier layer BR2 may be removed during the tertiary etching EC3 for removing the particles PTC. Thus, a groove HM may be formed in the second sub-barrier layer BR2. That is, as a portion in the thickness direction of the barrier layer BR corresponding to the transmission region TP is removed, the transmittance of light passing through the transmission region TP may be improved.

According to the abovementioned description, after forming an opening in a light blocking layer and at least one lower insulating layer, an additional etching is performed. Particles generated during the forming of the light blocking layer and the at least one lower insulating layer may be removed by the additional etching. As a result, the occurrence of defective pixels caused by the particles may be reduced. In addition, a portion in the thickness direction of the barrier layer corresponding to the transmission region is removed during the additional etching, and accordingly, the transmittance of light passing through the transmission region may be improved.

Although the inventive concept has been described with reference to a preferred embodiment of the inventive concept, it will be understood that the inventive concept should not be limited to these embodiments but various changes and modifications can be made by those skilled in the art without departing from the spirit and scope of the inventive concept as hereinafter claimed. Accordingly, the technical scope of the inventive concept is not intended to be limited to the contents set forth in the detailed description of the specification, but is intended to be defined by the appended claims.

What is claimed is:

1. An electronic device comprising:
    a display panel including a first region having a transmission region and an element region, and a second region disposed adjacent to the first region;
    a window disposed on the display panel;
    an electronic module disposed under the first region of the display panel; and a housing disposed under the display panel and the electronic module;

wherein the display panel includes:

a substrate;

a barrier layer disposed on the substrate;

a light blocking layer disposed on the barrier layer and having a first opening defining the transmission region;

at least one lower insulating layer disposed between the light blocking layer and the barrier layer, and having a second opening overlapping the first opening;

a plurality of pixel circuits disposed on the light blocking layer;

a plurality of light emitting elements electrically connected to the plurality of pixel circuits, respectively; and an encapsulation layer covering the plurality of light emitting elements, and wherein the barrier layer includes a groove recessed from an upper surface of the barrier layer and overlapping the second opening.

2. The electronic device of claim 1, wherein the barrier layer comprises a first sub-barrier layer disposed between the substrate and the at least one lower insulating layer, and a second sub-barrier layer disposed between the first sub-barrier layer and the at least one lower insulating layer, and wherein the first sub-barrier layer and the second sub-barrier layer are disposed in both the first region and the second region.

3. The electronic device of claim 2, wherein the groove is disposed in the second sub-barrier layer in the transmission region.

4. The electronic device of claim 2, wherein the second sub-barrier layer comprises a silicon oxide.

5. The electronic device of claim 2, wherein a thickness of a portion of the second sub-barrier layer disposed in the element region is greater than a thickness of a portion of the second sub-barrier layer disposed in the transmission region.

6. The electronic device of claim 1, wherein a sidewall of the at least one lower insulating layer defining the second opening protrudes more than a sidewall of the barrier layer defining the groove.

7. The electronic device of claim 1, wherein a sidewall of the at least one lower insulating layer defining the second opening protrudes more than a sidewall of the light blocking layer defining the first opening.

8. The electronic device of claim 1, wherein the at least one lower insulating layer comprises a first lower insulating layer disposed between the substrate and the light blocking layer, and a second lower insulating layer disposed between the first lower insulating layer and the substrate, and wherein a refractive index of the first lower insulating layer is different from a refractive index of the second lower insulating layer.

9. The electronic device of claim 8, wherein the first lower insulating layer comprises a silicon oxide and the second lower insulating layer comprises an amorphous silicon.

10. The electronic device of claim 1, wherein a size of the groove is larger than a size of the second opening in a plan view.

11. The electronic device of claim 1, wherein a portion of the at least one lower insulating layer overlaps the groove.

12. A method for manufacturing a display panel having a first region including a transmission region and an element region, and a second region disposed adjacent to the first region, the method comprising:

forming a barrier layer over a substrate;

forming at least one preliminary lower insulating layer on the barrier layer;

forming a preliminary light blocking layer on the at least one preliminary lower insulating layer;

forming a first opening in the preliminary light blocking layer and a second opening in the at least one preliminary lower insulating layer by primary etching a portion of the preliminary light blocking layer and a portion of the at least one preliminary lower insulating layer overlapping the transmission region;

forming a light blocking layer and a lower insulating layer by secondary etching a side surface of the first opening and a side surface of the second opening formed by the primary etching; and forming a groove in the barrier layer by tertiary etching a portion of the barrier layer exposed by the first opening and the second opening.

13. The method of claim 12, wherein the forming of the groove comprises wet etching a portion of the barrier layer exposed by the light blocking layer and the lower insulating layer using an etchant.

14. The method of claim 13, wherein the barrier layer comprises a silicon oxide layer, and the etchant is a buffered oxide etchant (BOE).

15. The method of claim 12, wherein the forming of the at least one preliminary lower insulating layer comprises:

forming an amorphous silicon layer on the barrier layer; and forming a silicon oxide layer on the amorphous silicon layer.

16. A display panel comprising:

a substrate;

a barrier layer disposed on the substrate;

a light blocking layer disposed on the barrier layer and having a first opening defining a transmission region;

at least one lower insulating layer disposed between the light blocking layer and the barrier layer, and having a second opening overlapping the first opening;

a plurality of pixel circuits disposed on the light blocking layer and not overlapping the transmission region;

a plurality of light emitting elements electrically connected to the plurality of pixel circuits, respectively; and an encapsulation layer covering the plurality of light emitting elements, wherein a thickness of the barrier layer disposed in an element region adjacent to the transmission region is greater than a thickness of the barrier layer disposed in the transmission region.

17. The display panel of claim 16, wherein the barrier layer comprises a first sub-barrier layer disposed between the substrate and the at least one lower insulating layer, and a second sub-barrier layer disposed between the first sub-barrier layer and the at least one lower insulating layer, and wherein the second sub-barrier layer includes a groove recessed from an upper surface of the second sub-barrier layer.

18. The display panel of claim 17, wherein the second sub-barrier layer comprises a silicon oxide.

19. The display panel of claim 16, wherein the at least one lower insulating layer comprises a first lower insulating layer disposed between the substrate and the light blocking layer, and a second lower insulating layer disposed between the first lower insulating layer and the substrate, and wherein a refractive index of the first lower insulating layer is different from a refractive index of the second lower insulating layer.

20. The display panel of claim 19, wherein the first lower insulating layer comprises a silicon oxide and the second lower insulating layer comprises an amorphous silicon.

\* \* \* \* \*